(12) United States Patent
Yamazawa et al.

(10) Patent No.: US 11,037,762 B2
(45) Date of Patent: Jun. 15, 2021

(54) PLASMA PROCESSING APPARATUS

(71) Applicant: Tokyo Electron Limited, Tokyo (JP)

(72) Inventors: Yohei Yamazawa, Yamanashi (JP); Naohiko Okunishi, Yamanashi (JP); Hironobu Misawa, Yamanashi (JP); Hidehito Soeta, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 475 days.

(21) Appl. No.: 15/798,714

(22) Filed: Oct. 31, 2017

(65) Prior Publication Data

US 2018/0053635 A1 Feb. 22, 2018

Related U.S. Application Data

(62) Division of application No. 13/975,674, filed on Aug. 26, 2013, now abandoned, which is a division of
(Continued)

(30) Foreign Application Priority Data

Mar. 30, 2009 (JP) ................................ 2009-082567

(51) Int. Cl.
*H01J 37/32* (2006.01)

(52) U.S. Cl.
CPC .... *H01J 37/32623* (2013.01); *H01J 37/3255* (2013.01); *H01J 37/32091* (2013.01); *H01J 37/32541* (2013.01); *H01J 37/32697* (2013.01)

(58) Field of Classification Search
CPC ........... H01J 37/32091; H01J 37/32541; H01J 37/32623
See application file for complete search history.

(56) References Cited

U.S. PATENT DOCUMENTS 5,273,060 A * 12/1993 Hill, III ................. B08B 3/006
134/111
5,478,429 A 12/1995 Komino et al.
(Continued)

FOREIGN PATENT DOCUMENTS

CN 1734712 A 2/2006
CN 101047114 A 10/2007
(Continued)

OTHER PUBLICATIONS

Chinese Office action for 201010139892.5 dated Jun. 29, 2011.

*Primary Examiner* — Karla A Moore
*Assistant Examiner* — Nathan K Ford
(74) *Attorney, Agent, or Firm* — Pearne & Gordon LLP

(57) ABSTRACT

A plasma processing apparatus includes at least one asymmetry member that causes a non-uniformity of plasma density around the high frequency electrode; and a plasma density distribution controller that is arranged depending on arrangement of the at least one asymmetry member to suppress the non-uniformity of plasma density around the high frequency electrode in the azimuthal direction. The plasma density distribution controller includes a first conductor which has first and second surfaces facing opposite directions to each other and is electrically connected with the rear surface of the high frequency electrode with respect to the first high frequency power; and a second conductor which includes a first connecting portion(s) electrically connected with a portion of the second surface of the first conductor and a second connecting portion electrically connected with a conductive grounding member electrically grounded around the high frequency electrode with respect to the first high frequency power.

15 Claims, 40 Drawing Sheets

Related U.S. Application Data application No. 12/748,601, filed on Mar. 29, 2010, now abandoned.

(60) Provisional application No. 61/186,912, filed on Jun. 15, 2009.

(56) References Cited

U.S. PATENT DOCUMENTS

| | | | |
|---|---|---|---|
| 2002/0170676 A1* | 11/2002 | Mitrovic | H01J 37/32082 156/345.47 |
| 2003/0103877 A1 | 6/2003 | Long | |
| 2004/0163593 A1 | 8/2004 | Aota | |
| 2005/0000654 A1* | 1/2005 | Morimoto | H01J 37/32082 156/345.47 |
| 2005/0269292 A1 | 12/2005 | Koshiishi | |
| 2005/0276928 A1* | 12/2005 | Okumura | H01J 37/32009 427/446 |
| 2008/0277064 A1 | 11/2008 | Kim | |
| 2009/0126634 A1* | 5/2009 | Yamazawa | C23C 16/5096 118/723 R |
| 2009/0242134 A1* | 10/2009 | Iwata | H01J 37/32091 156/345.48 |

FOREIGN PATENT DOCUMENTS

| | | |
|---|---|---|
| JP | 2004-193565 A | 7/2004 |
| JP | 2004-221571 A | 8/2004 |
| JP | 2004-363552 A | 12/2004 |
| JP | 2007-266529 A | 10/2007 |
| JP | 2008-244063 A | 10/2008 |

* cited by examiner

COMPARATIVE EXAMPLE

[X-Y PLOT]

847.3nm/M±8.2%

EMBODIMENT

[X-Y PLOT]

865. 6nm/M±7. 0%

[CONTOUR PLOT]

[CIRCUMFERENCE PLOT]

PLASMA PROCESSING APPARATUS

CROSS-REFERENCE TO RELATED APPLICATION

This is a divisional application of U.S. patent application Ser. No. 13/975,674, filed on Aug. 26, 2013, now abandoned, which is a divisional of U.S. patent application Ser. No. 12/748,601, filed on Mar. 29, 2010, now abandoned, which claims the benefit of Japanese Patent Application No. 2009-082567 filed on Mar. 30, 2009 and U.S. Provisional Application Ser. No. 61/186,912, filed on Jun. 15, 2009, the entire disclosures of which are incorporated herein by reference.

FIELD OF THE INVENTION

The present disclosure relates to a technique of performing a plasma process on a target object within a processing chamber including a high-frequency electrode. In particular, the present disclosure relates to a capacitively coupled plasma processing apparatus for generating plasma by a high-frequency discharge generated by applying a high frequency power to a high-frequency electrode.

BACKGROUND OF THE INVENTION

In a microprocessing or a processing such as etching, deposition, oxidation, and sputtering for manufacturing a semiconductor device or a FPD (Flat Panel Display), there has been used plasma so as to make a favorable reaction of a processing gas at a relatively low temperature. Typically, an electric discharge has been used for generating plasma, and plasma processing apparatuses are divided into two types: one is using a high-frequency discharge; and the other is using a microwave discharge. Apparatuses using the high-frequency discharge are divided into two types: one is a capacitance coupling type in which parallel plate electrodes are provided within a processing chamber; and the other is an induction coupling type in which a spiral-shaped electrode is installed around a processing chamber. Among them, the capacitance coupling type apparatus for generating plasma has been mainly employed as an apparatus for mass production and as an apparatus for device development.

In a capacitively coupled plasma processing apparatus, an upper electrode and a lower electrode are placed in parallel to each other within a depressurizable processing chamber or a reaction chamber; a target object such as a semiconductor wafer is mounted on the lower electrode; and a high frequency power of a predetermined frequency is applied to the upper electrode or the lower electrode via a matching unit. Electrons are accelerated by a high frequency electric field generated by this high frequency power and these accelerated electrons collide with molecules/atoms of a processing gas, resulting in dissociation/ionization therebetween and, thus, the processing gas is excited into plasma. By radicals or ions in the plasma, a required plasma process (e.g., etching process) is performed on a surface of a wafer.

In the plasma process, (in-plane) uniformity of the process is basically required for improvement in production yield and has been still more important along with miniaturization of semiconductor devices or scale-up of semiconductor wafers. Further, a required level of uniformity is getting higher.

In a conventional capacitively coupled plasma processing apparatus, process uniformity largely depends on plasma density uniformity on a semiconductor wafer, and, thus, recent studies have focused on a configuration of an electrode used for plasma generation, in particular, an electrode to which a high frequency power is applied (i.e., a high-frequency electrode). To be specific, in the capacitively coupled apparatus, plasma density is likely to be distributed in a mountain-shaped profile in which the plasma density is relatively highest at a central portion of the electrode and becomes low around the central portion. Therefore, there is employed an electrode configuration in which a high-frequency electrode is divided into two parts in a diametrical direction or an electrode configuration in which a dielectric member having a thickness decreasing from the center of the electrode toward the edge of the electrode is installed on a main surface or a surface of a high-frequency electrode, so that a high frequency electric field on the electrode becomes relatively strong at its edge and weak at its center. Therefore, the plasma density can be distributed uniformly.

Patent Document 1: Japanese Patent Laid-open Publication No. 2004-193565

Patent Document 2: Japanese Patent Laid-open Publication No. 2004-363552

However, in a capacitively coupled plasma processing apparatus, if a high-frequency electrode has a function to control plasma density as described above, it becomes very complicated to manufacture such a high-frequency electrode, and a high manufacturing cost is required. Further, a degree of freedom to control the plasma density becomes low. In particular, there is a problem in making the plasma density uniform in an azimuthal direction.

Generally, non-uniformity of the plasma density in the azimuthal direction is caused by asymmetry in a configuration of the plasma processing apparatus. That is, in the plasma processing apparatus for semiconductor processes, a parallel plate electrode formed in a circular plate shape is installed at the center of a cylindrical processing chamber, but axial asymmetry is shown around the electrode. For example, a shutter, installed at a sidewall of the processing chamber, for transferring semiconductor wafers causes the axial asymmetry around the electrode in the apparatus configuration. Further, an electrostatic chuck for attracting and holding a semiconductor wafer during a process or a resistance heating element for heating the semiconductor wafer during a wafer temperature control is installed on an electrode (susceptor) serving as a wafer mounting table in an axial symmetrical manner. However, power feed terminals and power feed lines for the electrostatic chuck or the resistance heating element are installed or wired in an axially asymmetrical manner with respect to the susceptor, which also causes the axial asymmetry around the susceptor.

The plasma density distribution on an electrode may have an unbalance in an azimuthal direction due to the axial asymmetry in the apparatus configuration, which becomes an obstacle to high performance required for the plasma processing apparatus.

BRIEF SUMMARY OF THE INVENTION

In order to solve the conventional problems described above, the present disclosure provides a plasma processing apparatus and a plasma processing method capable of improving uniformity of plasma density distribution and process characteristics by greatly improving performance and the degree of freedom for controlling the plasma density distribution.

In accordance with a first aspect of the present disclosure, there is provided a plasma processing apparatus in which a high frequency electrode is provided in a processing chamber. When a plasma process is performed on a target object in the processing chamber, a first high frequency power is applied to a rear surface of the high frequency electrode and a surface of the high frequency electrode is exposed to plasma of a processing gas. The plasma processing apparatus includes a first conductor which has first and second surfaces facing opposite directions to each other and is electrically connected with the rear surface of the high frequency electrode with respect to the first high frequency power, the first surface facing a portion of the rear surface of the high frequency electrode; and a second conductor which includes a first connecting portion(s) electrically connected with a portion of the second surface of the first conductor and a second connecting portion electrically connected with a conductive grounding member electrically grounded around the high frequency electrode with respect to the first high frequency power.

In the above-described plasma processing apparatus, the surface of the high frequency electrode is exposed to the plasma within the processing space, and most of the high frequency power applied from the high frequency power supply is radiated toward the plasma. Meanwhile, the rear surface of the high frequency electrode is not exposed to the plasma but it is electrically connected with the adjacent conductive grounding member via the first and second conductors with respect to the high frequency power, and, thus, some of the high frequency power supplied from the high frequency power supply flows from the rear surface of the high frequency electrode to the conductive grounding member through the first and second conductors. In this case, the plasma distribution on the high frequency electrode or the plasma distribution on the target object has an unbalance around a position starting from a position of the first connecting portion of the first conductor in a two-dimensional direction (particularly, in an azimuthal direction). A degree of the unbalance varies depending on a spatial profile (e.g., position and area) of the conductive plate.

Therefore, when a certain unbalance (particularly, a certain unbalance in the azimuthal direction) occurs in the plasma distribution on the high frequency electrode or in process characteristics on the target object due to asymmetry in the apparatus configuration around the high frequency electrode, the unbalance can be effectively canceled or corrected by a synergistic function or operation of the first and second conductors.

In accordance with the present disclosure, the first conductor may be a conductive plate having the first and second surfaces substantially parallel to each other and the first conductor may be capacitively coupled to the rear surface of the high frequency electrode. Further, a high frequency power feed rod for supplying the first high frequency power to the high frequency electrode may be connected with a central portion of the rear surface of the high frequency electrode, and the first and second conductors may be distanced away from the high frequency power feed rod in a radial direction.

In accordance with the present disclosure, the second conductor may be a column-shaped body, and its one end may serve as the first connecting portion and the other end or a middle portion between the one end and the other end may serve as the second connecting portion. In accordance with the present disclosure, the second conductor may be a plate-shaped body or a cylinder-shaped body, and its one end surface may serve as the first connecting portion and the other end surface or a middle portion between the one end surface and the other end surface may serve as the second connecting portion.

In accordance with the present disclosure, the second conductor may include one or more first connecting portions and all the first connecting portions may be arranged around a half-circumference in the azimuthal direction.

In accordance with the present disclosure, the first conductor may include a plurality of first conductive members and the height of the first conductive members may be independently controlled or adjusted. In this case, the second conductor may have the first connecting portions connected with each of the first conductive members.

If the second conductor includes second conductive members or a plurality of the first connecting portions is installed on the single second conductor, the plurality of the first connecting portions may be substantially equi-spaced along an azimuthal direction. In this case, characteristics of the plasma density distribution and the sheath electric intensity distribution on the high frequency electrode or the process characteristics on the target object are not arbitrarily biased. Instead, unbalance caused by asymmetry in the apparatus configuration can be suppressed or corrected by force or balance maintaining power for making these characteristics uniform.

In accordance with the present disclosure, the plasma processing apparatus may further include a first conductor moving unit for varying a position of the first conductor with respect to the high frequency electrode. The first conductor moving unit may vary the position of the first conductor in a vertical direction with respect to the rear surface of the high frequency electrode, or in an azimuthal direction or in a radial direction with respect to the high frequency electrode.

Further, the plasma processing apparatus may further include a second conductor moving unit for varying a position of the first connecting portion of the second conductor with respect to the high frequency electrode. The second conductor moving unit may vary the position of the first connecting portion of the second conductor in a vertical direction with respect to the rear surface of the high frequency electrode, or in an azimuthal direction or in a radial direction with respect to the high frequency electrode.

When the second conductor is rotated at a constant speed in the azimuthal direction of the high frequency electrode during the plasma process, it is possible to achieve uniformity in distribution of sheath electric field intensity, distribution of plasma density or process characteristics in its diametrical direction as well as in the azimuthal direction.

The present disclosure can be appropriately applied to a capacitively coupled plasma processing apparatus including parallel plate electrodes. In particular, if an electrostatic chuck or a resistance heating element is provided on a surface of the high frequency electrode, a wiring connection point of the electrostatic chuck or a wiring connection point of the resistance heating element causes unbalance in the plasma density distribution or process characteristics in a two-dimensional direction. In such a case, the unbalance can be effectively canceled.

In accordance with a second aspect of the present disclosure, there is provided a plasma processing method for performing a plasma process on a target object by using the plasma processing apparatus of the first aspect. The method includes controlling plasma density distribution on the high frequency electrode or plasma characteristics on the target object by varying or adjusting a position of the first conductor with respect to the rear surface of the high frequency electrode. Alternatively, the method is performed by varying or adjusting a capacitance of a capacitor formed between the rear surface of the high frequency electrode and the first conductor; or by varying or adjusting a position of the first connecting portion of the second conductor with respect to the rear surface of the high frequency electrode.

In accordance with a third aspect of the present disclosure, there is provided a plasma processing apparatus in which a facing electrode faces a high frequency electrode parallel to each other at a predetermined distance therebetween in a processing chamber. When a plasma process is performed on a target object within the processing chamber, a first high frequency power is applied to a rear surface of the high frequency electrode, and each surface of the high frequency electrode and the facing electrode is exposed to plasma of a processing gas. The plasma processing apparatus includes a first conductor which has first and second surfaces facing opposite directions to each other and is electrically connected with a rear surface of the facing electrode with respect to the first high frequency power, the first surface facing a portion of the rear surface of the facing electrode; and a second conductor which includes a first connecting portion electrically connected with a portion of the second surface of the first conductor and a second connecting portion electrically connected with a conductive member electrically grounded around the facing electrode with respect to the first high frequency power.

In the above-described plasma processing apparatus, the surface of the facing electrode is exposed to the plasma within the processing space and a high frequency current is introduced from the high frequency electrode. The rear surface of the facing electrode is not exposed to the plasma but it is electrically connected with the adjacent conductive grounding member via the first and second conductors with respect to the high frequency power, and, thus, some of the high frequency current introduced from its surface flows from the rear surface of the facing electrode to the conductive grounding member through the first and second conductors. In this case, the plasma distribution on the facing electrode has an unbalance around a position starting from a position of the first connecting portion of a conductive rod in a two-dimensional direction (particularly, in an azimuthal direction). A degree of the unbalance varies depending on a spatial profile (e.g., position and area) of a conductive plate. The characteristic of the plasma distribution on the facing electrode can be controlled by a synergistic function or operation of the first and second conductors.

In accordance with a fourth aspect of the present disclosure, there is provided a plasma processing method for performing a plasma process on a target object by using the plasma processing apparatus of the third aspect. The method may include controlling plasma density distribution on the high frequency electrode or plasma characteristics on the facing electrode by varying or adjusting a position of the first conductor with respect to the rear surface of the facing electrode. Alternatively, the method is performed by varying or adjusting a capacitance of a capacitor formed between the rear surface of the facing electrode and the first conductor; or by varying or adjusting a position of the first connecting portion of the second conductor with respect to the rear surface of the facing electrode.

As described above, in accordance with the plasma processing apparatus of the present disclosure, it is possible to improve uniformity of plasma density distribution by greatly improving performance and the degree of freedom for controlling the plasma density distribution by the above-described configurations and operations. Further, in accordance with the plasma processing method of the present disclosure, it is possible to improve uniformity of process characteristics by the above-described configurations and operations.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present disclosure will be described in detail with reference to the accompanying drawings.

Figure 1:
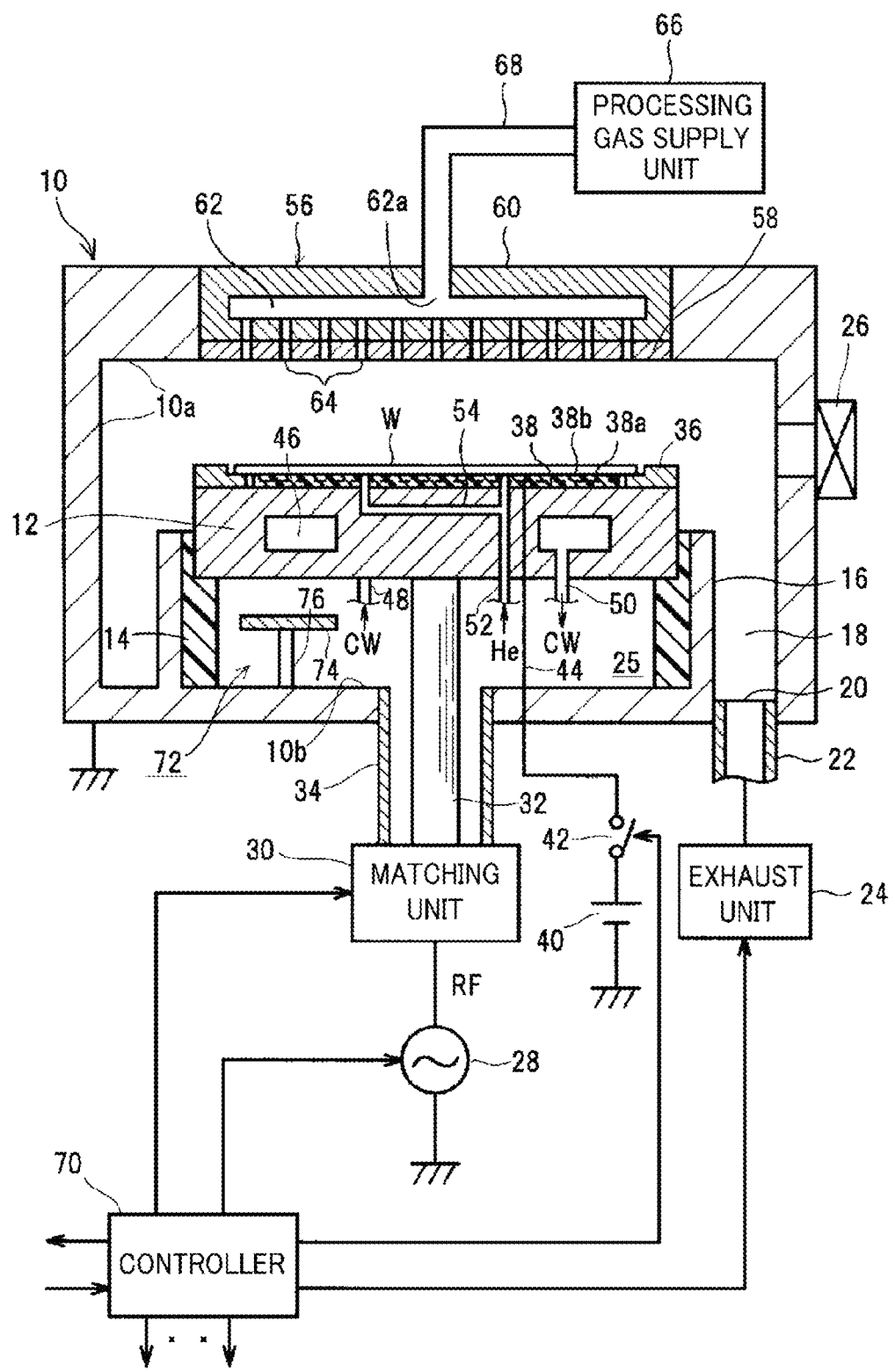
FIG. 1 is a cross-sectional view of a configuration of a plasma processing apparatus in accordance with an embodiment of the present disclosure.

FIG. 1 is a configuration view of a plasma processing apparatus in accordance with an embodiment of the present disclosure. This plasma processing apparatus is a capacitively coupled plasma etching apparatus of a cathode-couple type, which includes a cylindrical chamber (processing vessel) 10 made of metal such as aluminum or stainless steel. The chamber 10 is frame-grounded.

A circular plate-shaped susceptor 12, serving as a lower electrode, for mounting thereon a target substrate such as semiconductor wafer W is horizontally installed within the chamber 10. The susceptor 12 is made of conductive metal such as aluminum and supported by a cylindrical insulating member 14 extending vertically upward from the bottom of the chamber 10 without being grounded. Along an outer periphery of the cylindrical insulating member 14, a ring-shaped exhaust line 18 is formed between a cylindrical conductor 16 extending vertically upward from the bottom of the chamber 10 and an inner wall of the chamber 10, and an exhaust port 20 is provided at the bottom of the exhaust line 18. The exhaust port 20 is connected with an exhaust unit 24 via an exhaust pipe 22. The exhaust unit 24 has a vacuum pump such as a turbo-molecular pump to depressurize a processing space within the chamber 10 up to a predetermined vacuum level. Provided at the sidewall 10a of the chamber 10 is a gate valve 26 for opening/closing a loading/unloading port for the semiconductor wafer W.

Formed below the susceptor 12 is a chamber lower room 25 which is surrounded by a rear surface of the susceptor 12, an inner wall of the cylindrical insulating member 14, and a bottom wall 10b of the chamber 10 in a non-depressurized atmosphere (typically, in an atmospheric atmosphere). Within the chamber lower room 25, the whole or main parts of a plasma density distribution controller 72 of the etching apparatus are installed. A configuration and an operation of the plasma density distribution controller 72 will be explained in detail later.

The susceptor 12 is electrically connected with a high-frequency power supply 28 via a matching unit 30 and a power feed rod 32. The power feed rod 32 is enclosed with a cylindrical conductive cover or outer conductor 34 which is electrically grounded. The high-frequency power supply 28 outputs a high frequency (RF) power of a predetermined frequency (typically, about 13.56 MHz or higher) so as to generate plasma of a processing gas by a high-frequency discharge within the chamber 10 for each process. The matching unit 30 includes a matching device (not illustrated) for matching an internal impedance of the high-frequency power supply 28 with a load impedance.

The susceptor 12 has a slightly larger diameter than that of the semiconductor wafer W. A main surface, i.e., top surface, of the susceptor 12 is divided into a central portion, i.e., wafer mounting portion, which is of substantially same shape (circular shape) and of substantially same size as the wafer W, and a ring-shaped peripheral portion extending outwardly from the wafer mounting portion in a radial direction. The semiconductor wafer W as a target object is mounted on the wafer mounting portion, and a focus ring 36 having a slightly larger inner diameter than a diameter of the semiconductor wafer W is placed on the ring-shaped peripheral portion. The focus ring 36 is made of any one of materials such as Si, SiC, C, and $SiO_2$ depending on a kind of etching target material of the semiconductor wafer W.

Installed on the wafer mounting portion of the susceptor 12's top surface is an electrostatic chuck 38 for attracting and holding a wafer. In the electrostatic chuck 38, a DC electrode 38b is embedded within a film- or plate-shaped dielectric member 38a and the electrostatic chuck 38 is integrally formed on and fixed to the susceptor 12's top surface. The DC electrode 38b is electrically connected with a DC power supply 40, which is placed outside the chamber 10, via a switch 42 and a DC high-voltage line 44. By applying a DC high voltage from the DC power supply 40 to the DC electrode 38b, the semiconductor wafer W can be attracted to and held on the electrostatic chuck 38 by an electrostatic attracting force.

Provided within the susceptor 12 is a ring-shaped coolant reservoir or coolant path 46 extending along a circumferential direction thereof, for example. A coolant such as cooling water CW of a predetermined temperature is supplied and circulated into the coolant reservoir 46 from a chiller unit (not illustrated) through coolant supply lines 48 and 50. Further, a heat transfer gas such as a He gas, for controlling a temperature of the semiconductor wafer W via the susceptor 12 is supplied from a heat transfer gas supply unit (not illustrated) into a space between the electrostatic chuck 38 and the semiconductor wafer W through a gas supply line 52 and a gas path 54 within the susceptor 12.

At a ceiling portion of the chamber 10, a shower head 56 serving as a parallel plate upper electrode (facing electrode) facing the susceptor 12 parallel to each other is directly fixed (anode ground) to the chamber 10. The shower head 56 includes an electrode plate 58 facing the susceptor 12 and an electrode support 60 for detachably supporting the electrode plate 58 from its back (top) side. A gas room 62 is provided within the electrode support 60 and a plurality of gas discharge holes 64 is formed in the electrode support 60 and the electrode plate 58 toward the susceptor 12 from the gas room 62. A space sandwiched between the electrode plate 58 and the susceptor 12 becomes a plasma generation space as well as a processing space. A gas inlet 62a formed at an upper part of the gas room 62 is connected with a processing gas supply unit 66 via a gas supply pipe 68. The electrode plate 58 is made of, e.g., Si, SiC or C, and the electrode support 60 is made of, e.g., alumite-treated aluminum.

For example, a controller 70 includes a microcomputer and controls each operation of each unit of the plasma etching apparatus including the exhaust unit 24, the high-frequency power supply 28, the matching unit 30, the switch 42 for the electrostatic chuck 38, the chiller unit (not illustrated), the heat transfer gas supply unit (not illustrated), the processing gas supply unit 66, and the plasma density distribution controller 72 or an overall operation (sequence) of the plasma etching apparatus.

In an etching process of the plasma etching apparatus, after the gate valve 26 is first opened, the semiconductor wafer W as an etching target object is loaded into the chamber 10 and mounted on the electrostatic chuck 38. Then, an etching gas (generally, a mixed gas) is introduced from the processing gas supply unit 66 into the chamber 10 at a predetermined flow rate and flow rate ratio, and an internal pressure of the chamber 10 is adjusted to a setting level by the exhaust unit 24. Further, by turning on the high-frequency power supply 28, the high frequency (RF) power is outputted at a predetermined power level, and the high frequency (RF) power is applied to the susceptor 12 via the matching device of the matching unit 30 and the power feed rod 32. Furthermore, the heat transfer gas supply unit supplies the heat transfer gas (He gas) into a contact interface between the electrostatic chuck 38 and the semiconductor wafer W, and with the switch on, the heat transfer gas is confined in the contact interface by the electrostatic attracting force of the electrostatic chuck 38. The etching gas discharged from the shower head 56 is excited into plasma by a high-frequency discharge between both electrodes 12 and 56. By radicals or ions contained in the plasma, an etching target film on the semiconductor wafer W's surface is etched in a desired pattern.

Figure 2:
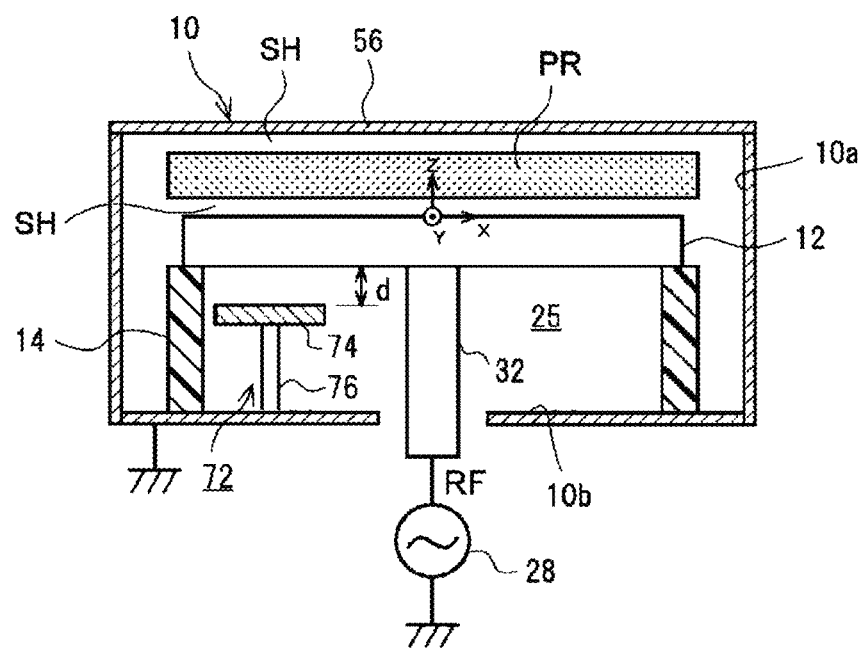
FIG. 2 is a longitudinal cross-sectional view illustrating a schematic configuration of a main part of a plasma processing apparatus in accordance with the embodiment of the present disclosure.

As described above, in the plasma etching apparatus, plasma of the processing gas is generated by a capacitively coupled high-frequency discharge in the depressurized processing space of the chamber 10. To be more specific, as depicted in FIG. 2, in a configuration of parallel plate electrodes of a cathode-couple type, when the high frequency (RF) power is applied from the high-frequency power supply 28 to a rear surface of the susceptor 12, a high-frequency electric field (sheath electric field) is generated between the susceptor 12, the upper electrode 56, and the chamber's sidewall 10a (more specifically, at a sheath SH). Electrons accelerated by the sheath electric field, particularly, the sheath electric field on the susceptor 12 collides with molecules/atoms of the processing gas, resulting in dissociation/ionization therebetween, and, thus, the processing gas is excited into plasma PR.

The process characteristics (etching rate, CD or the like) on the semiconductor wafer W largely depend on the plasma density on the susceptor 12. Therefore, as in-plane uniformity of the plasma density increases, in-plane uniformity of the process characteristics becomes increased.

In the above-described embodiment, the plasma density distribution controller 72 is installed in the chamber lower room 25 so as to control the plasma density distribution on the susceptor 12 by the capacitively coupled high-frequency discharge.

First Embodiment

The plasma density distribution controller 72 in accordance with a first embodiment includes a conductive plate (first conductor) 74 which is placed substantially parallel (horizontally) under the rear surface of the susceptor 12 at a certain position to face the susceptor 12 and a conductive rod (second conductor) 76 which supports the conductive plate 74 upward and is electrically grounded. Both the conductive plate 74 and the conductive rod 76 are made of conductive metal such as copper or aluminum.

Figure 3A:
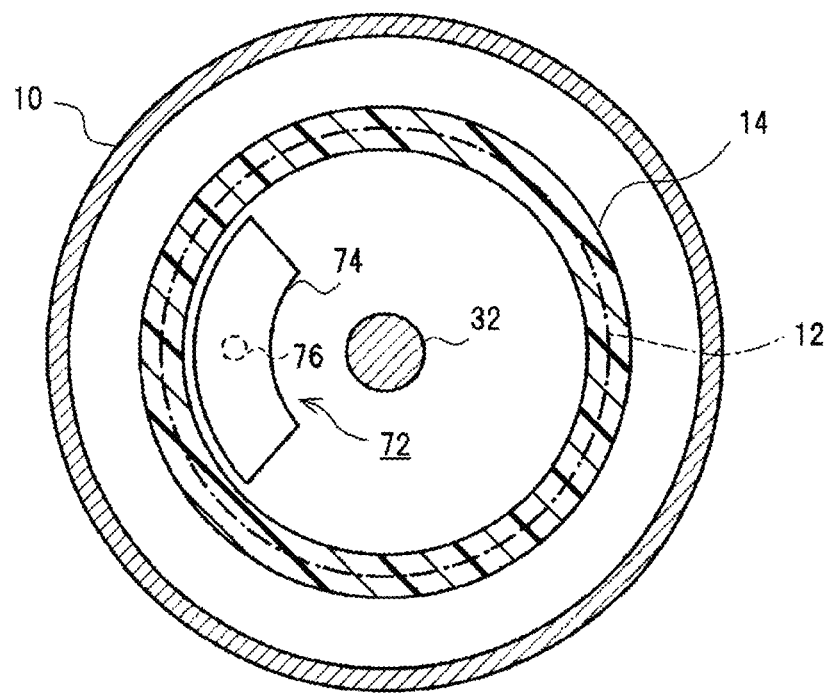
FIG. 3A is a transversal cross-sectional view illustrating a schematic arrangement configuration (first layout) of a plasma density distribution controller in an X-Y direction in accordance with a first embodiment.
Figure 3B:
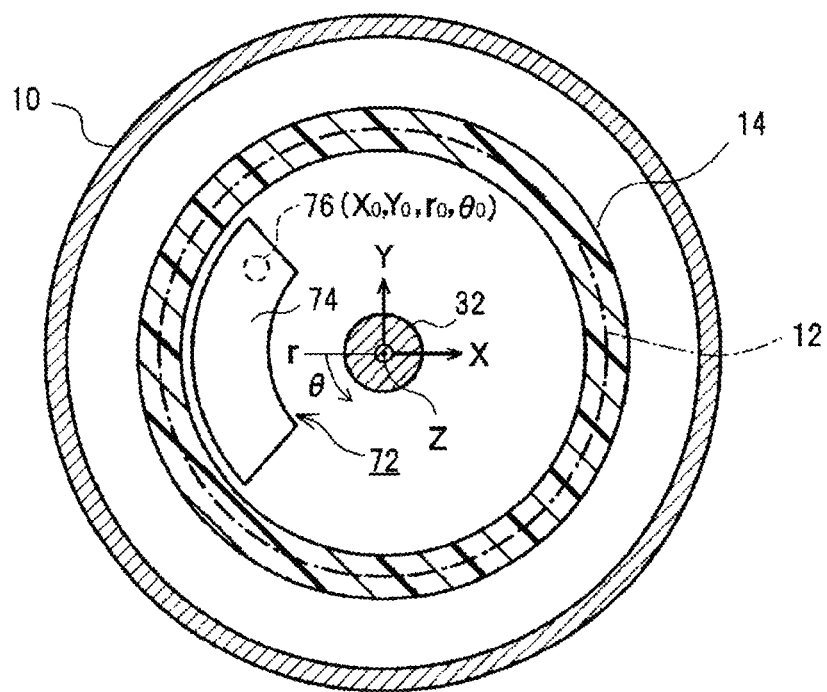
FIG. 3B is a transversal cross-sectional view illustrating a schematic arrangement configuration (second layout) of a plasma density distribution controller in an X-Y direction in accordance with the first embodiment.

To be more specific, the conductive plate 74 is extended in a circular arc shape along a circumference direction of the power feed rod 32 or along an inner wall of the cylindrical insulating member 14, and is distanced from the rear surface of the susceptor 12 at a certain distance d. The conductive rod 76 is uprightly extended from the conductive plate 74. An upper end (first connecting portion) of the conductive rod 76 is fixed to a certain portion of a bottom surface of the conductive plate 74, for example, around the center of the bottom surface of the conductive plate 74 as depicted in FIG. 3A, or around one end of the bottom surface of the conductive plate 74 as shown in FIG. 3B. A lower end (second connecting portion) of the conductive rod 76 is fixed to or is in contact with the bottom wall 10b of the chamber 10.

In the plasma density distribution controller 72 configured as stated above, the conductive plate 74 is capacitively coupled and electrically connected with the rear surface of the susceptor 12 located directly above the conductive plate 74, with respect to the high frequency (RF) power applied to the susceptor 12 from the high-frequency power supply 28. Further, the lower end (second connecting portion) of the conductive rod 76 is electrically connected with the bottom wall 10b of the chamber 10 at a ground potential. Accordingly, with respect to the high frequency (RF) power, the surface of the susceptor 12 is capacitively coupled and electrically connected with the upper electrode 56 and the chamber's sidewall 10a at a ground potential via plasma PR under a depressurized atmosphere. Meanwhile, the rear surface of the susceptor 12 is electrically connected with the high-frequency power supply 28 via a high-frequency power feed line including the power feed rod 32 and the matching unit 30 under an atmospheric atmosphere. Further, the rear surface of the susceptor 12 is electrically connected with the chamber's bottom wall 10b (conductive grounding member) through the plasma density distribution controller 72.

Hereinafter, the operations of the plasma density distribution controller 72 will be explained with reference to FIGS. 4 to 7.

In a first experimental example, the plasma etching apparatus (first embodiment apparatus) including the plasma density distribution controller 72 illustrated in FIG. 1 and the same kind of plasma etching apparatus (comparative example apparatus) not including the plasma density distribution controller 72 are used. In both the apparatuses, plasma etching processes were performed on the semiconductor wafers W of about 300 mm in diameter based on a preset recipe (hereinafter, referred to as "recipe A"), and etching rates were measured at a plurality of points on the semiconductor wafers W. Distribution of etching rates obtained from the comparative example apparatus is shown in FIG. 4 and distribution of etching rates obtained from the first embodiment apparatus is shown in FIG. 5.

In the first embodiment apparatus, the plasma density distribution controller 72 has a layout as shown in FIG. 3B. If a coordinate position of the conductive rod 76 in an X-Y plane is denoted by $X_o$ and $Y_o$, a radial distance in an r-θ plane is denoted by $r_o$, and an angular position is denoted by $\theta_o$, $X_o$ is about −85 mm, $Y_o$ is about 85 mm, $r_o$ is about 120 mm, and $\theta_o$ is about 315°.

Figure 4:
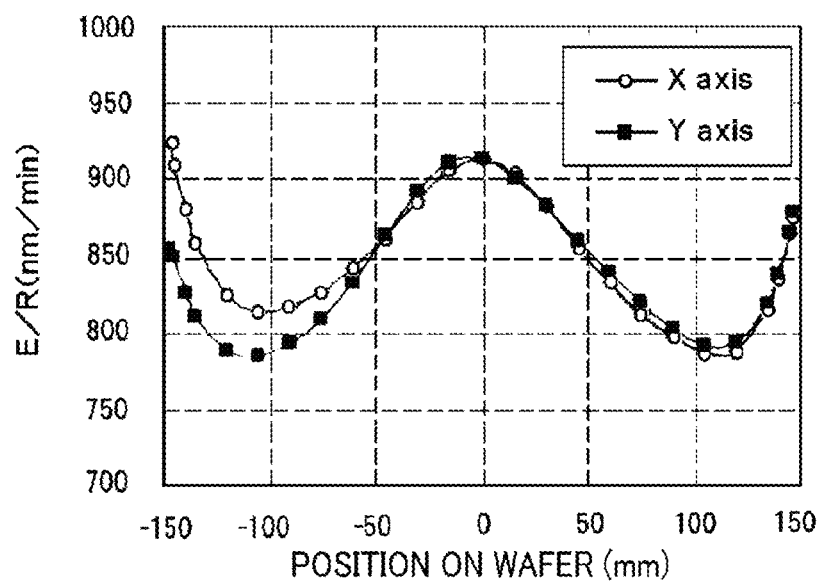
FIG. 4 is a view of etching rate distribution obtained by an apparatus of a comparative example in a first experimental example.
Figure 5:
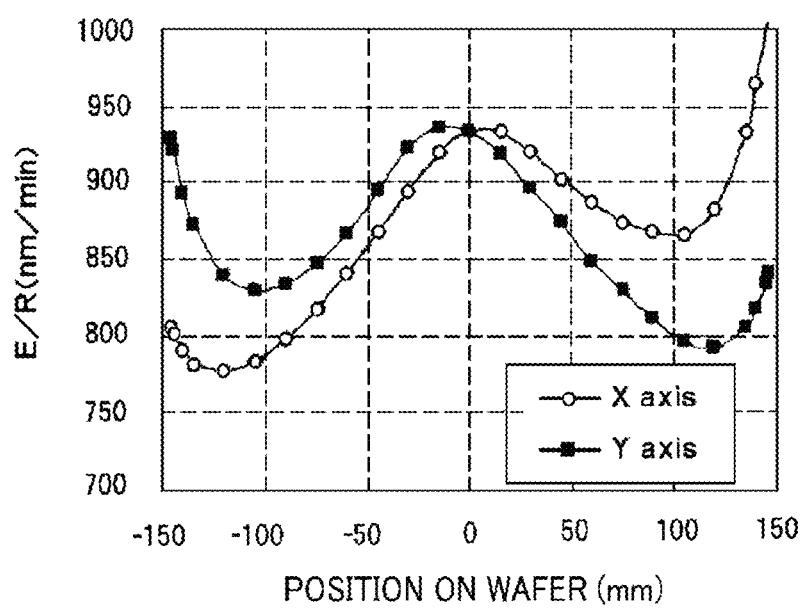
FIG. 5 is a view of etching rate distribution obtained by an apparatus of the first embodiment in the first experimental example.

As depicted in FIGS. 4 and 5, in both the comparative example apparatus and the first embodiment apparatus, the etching rates of the plasma etching process based on the recipe A are relatively high at the center and the edge of the semiconductor wafer W and is low at the middle portion thereof.

In the comparative example apparatus (see FIG. 4), however, a distribution characteristic (profile) of the etching rates exhibits high symmetry in the right and left (±) side on a Y-axis, whereas on an X-axis, the distribution characteristic in the left (−) side is slightly increased as compared to that in the right (+) side. Therefore, there is slight unbalance in an azimuthal direction.

As for the first embodiment apparatus (see FIG. 5), a distribution characteristic (profile) of the etching rates is remarkably modified around a position starting from a position of the plasma density distribution controller 72, particularly, from a position of the conductive rod 76. To be more specific, along the X-axis, the etching rates around the position (about −85 mm) of the conductive rod 76 are greatly decreased as if pulled downward, while the etching rates around its opposite position (point symmetry) (about 85 mm) are greatly increased as if pulled upward. Along the Y-axis, the etching rates around the position (about 85 mm) of the conductive rod 76 are greatly decreased as if pulled downward, while the etching rates around its opposite position (point symmetry) (about −85 mm) are greatly increased as if pulled upward. To be noted is that a profile of the etching rates in an azimuthal direction can be modified by providing the conductive rod 76

As for an average of the etching rates and the in-plane uniformity, the comparative example apparatus (FIG. 4) has about 847.3 nm/min±8.2%, whereas the first embodiment apparatus (see FIG. 5) has about 865.6 nm/min±7.0%. Therefore, it can be seen that the first embodiment apparatus (FIG. 5) is improved.

Figure 6A:
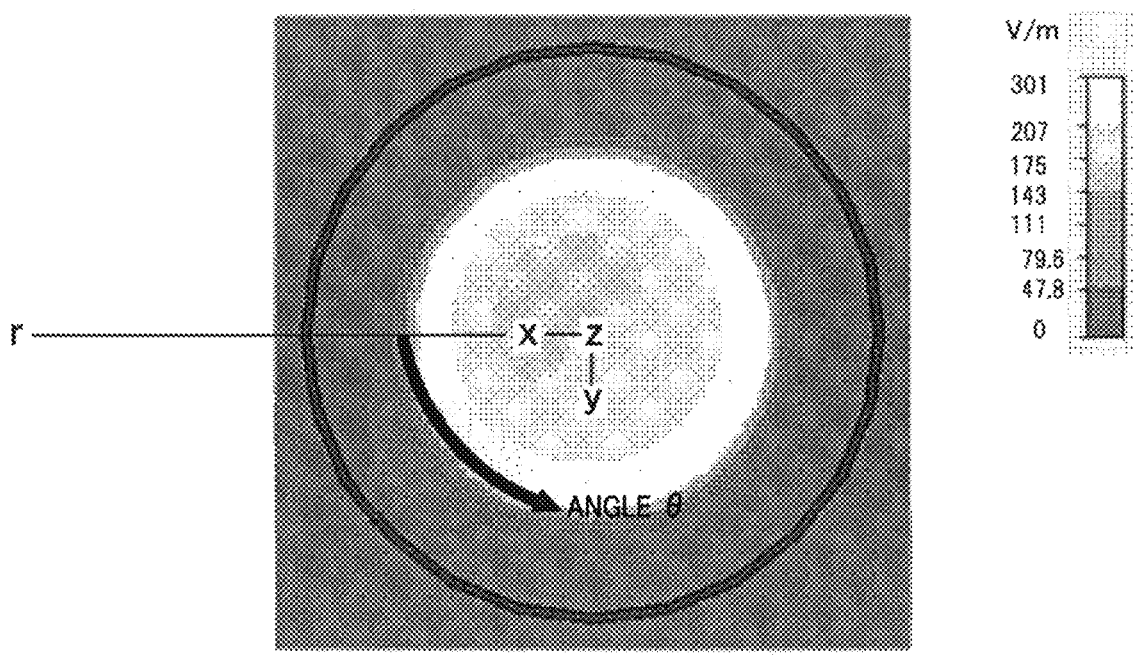
FIG. 6A shows a contour plot of plasma density distribution obtained by the apparatus of the first embodiment in the first experimental example.
Figure 6B:
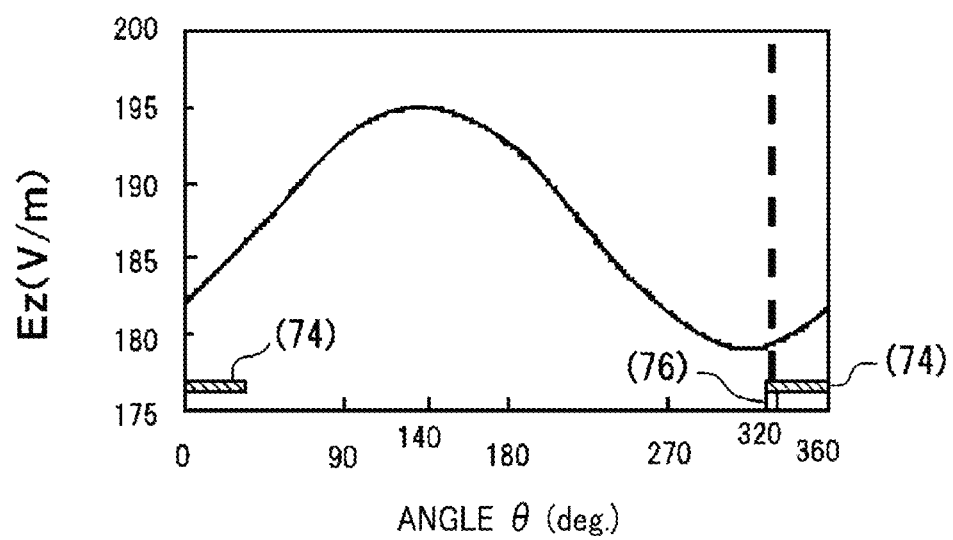
FIG. 6B shows a circumference plot of plasma density distribution obtained by the apparatus of the first embodiment in the first experimental example.

FIGS. 6A and 6B illustrate distribution of electric field intensity on a surface of the susceptor 12, i.e., sheath electric field $E_z$ intensity, obtained by an electromagnetic field simulation in the first embodiment apparatus. In the electromagnetic field simulation, a DC voltage is not applied to the DC electrode 38b of the electrostatic chuck 38 and the plasma PR generated in the processing space within the chamber 10 is regarded as a dielectric disc.

As depicted in FIGS. 6A and 6B, the sheath electric field $E_z$ on the susceptor 12 is represented by an approximately sine curve along a circumference direction or azimuthal direction, and the sheath electric field $E_z$ has a minimum value around a position (about 315°) corresponding to a position of the conductive rod 76 of the plasma density distribution controller 72 and a maximum value around its opposite position (point symmetry) (about) 135° 180° away from the position.

Although illustration is omitted, the present inventors have obtained electric field intensity on the conductive plate 74 of the plasma density distribution controller 72 through the electromagnetic simulation, and found that the electric field intensity has a minimum value at a position corresponding to a position of the conductive rod 76 and the electric field intensity increases as a distance from the conductive rod 76 increases. The most important part of the conductive rod 76 is its upper end (first connecting portion) electrically connected with the bottom surface of the conductive plate 74 and a characteristic of the electric field intensity distribution shows extremes at this position. The middle portion and the lower end (second connecting portion) of the conductive rod 76 just function as a path for electrically grounding the upper end (first connecting portion) of the conductive rod 76 and the conductive plate 74, and their spatial or positional profile is not much important.

As described above, in the plasma etching apparatus in this embodiment, if the plasma density distribution controller 72 is installed in the chamber lower room 25, the plasma density distribution and the sheath electric field intensity on the susceptor 12 and the process characteristics on the semiconductor wafer W can be intentionally (i.e., controllably) varied depending on a position of the plasma density distribution controller 72, particularly, a position of the upper end (first connecting portion) of the conductive rod 76 in a two-dimensional direction (particularly, in an azimuthal direction).

The conductive plate 74 of the plasma density distribution controller 72 is capacitively coupled to the rear surface of the susceptor 12, whereby the conductive plate 74 has a function of adjusting the effect of the plasma density distribution controller 72 to be strong or weak.

Figure 7:
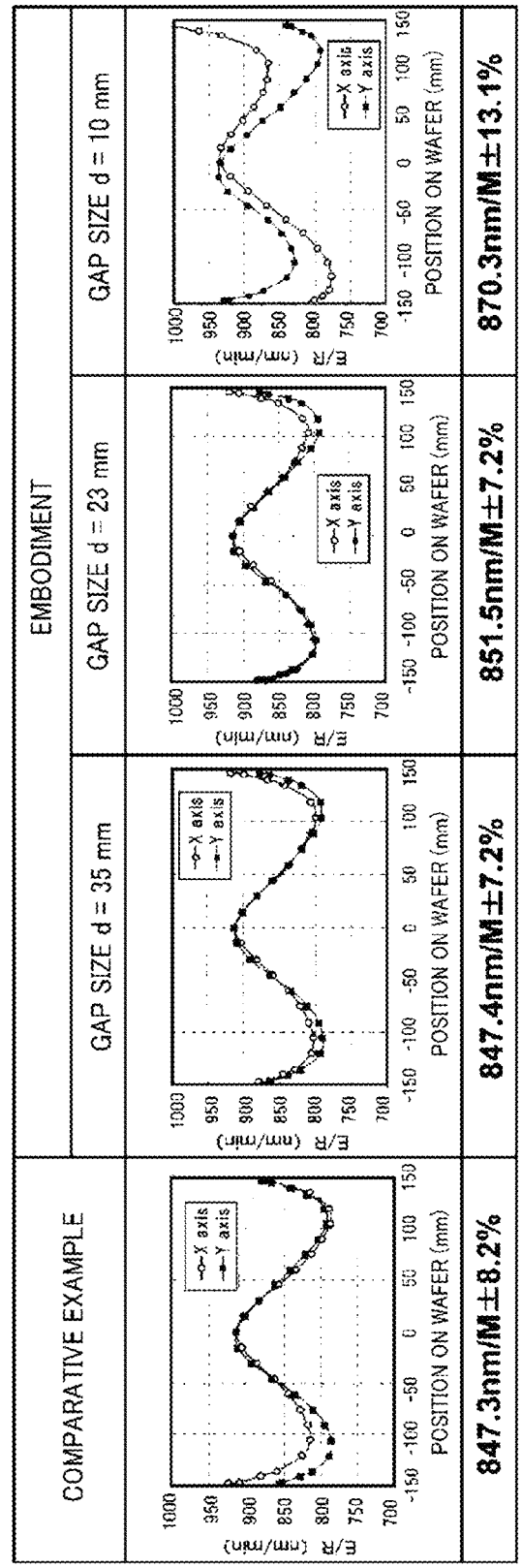
FIG. 7 is a view of etching rate distribution when a gap size on a conductive plate of a plasma density distribution controller of the first embodiment apparatus is used as a parameter.

FIG. 7 shows etching rate distribution in each case that a gap size d on the conductive plate 74 of the first embodiment apparatus in the first experimental example (recipe A) is about 10 mm, about 23 mm, and about 35 mm. Further, data of the comparative example apparatus seen on the left of FIG. 7 are the same as data of the comparative example apparatus illustrated in FIG. 4.

As depicted in FIG. 7, as for average of the etching rates and the in-plane uniformity, the comparative example apparatus has about 847.3 nm/min±8.2%, whereas the first embodiment apparatus has about 847.4 nm/min±7.2% when d is about 35 mm; about 851.5 nm/min±7.2% when d is about 23 mm; and about 870.3 nm/min±13.1% when d is about 10 mm.

That is, as compared to the comparative example apparatus, in the first embodiment apparatus, when d is about 35 mm, the average of the etching rates is hardly changed but the in-plane uniformity can be improved; when d is about 10 mm, the in-plane uniformity is deteriorated but the average can be improved; and when d is about 23 mm, both the average and the in-plane uniformity can be improved.

It can be seen from the profiles in FIG. 7 that, in the first embodiment apparatus, as the gap size d on the conductive plate 74 becomes small, the effect of the plasma density distribution controller 72 becomes strong. That is, the effect of producing unbalance of the process characteristics on the semiconductor wafer W around a position starting from the position of the upper end (first connecting portion) of the conductive rod 76 in a two-dimensional direction (particularly, in an azimuthal direction) becomes strong.

In short, as a capacitance of the capacitive coupling between the rear surface of the susceptor 12 and the conductive plate 74 is increased, the effect of the plasma density distribution controller 72 becomes strong. Therefore, if the area of the conductive plate 74 is increased or a dielectric constant in the gap is increased instead of decreasing the gap size d on the conductive plate 74, the capacitance can be increased so that the effect of the plasma density distribution controller 72 becomes strong. On the contrary, if the gap size d is increased, or the area of the conductive plate 74 is decreased or the dielectric constant in the gap is decreased, a capacitance can be decreased so that the effect of the plasma density distribution controller 72 becomes weak.

In accordance with the first embodiment, if a certain unbalance (particularly, a certain unbalance in the azimuthal direction) occurs in the the plasma density distribution on the susceptor 12 or in the process characteristics on the semiconductor wafer W due to asymmetry in a configuration around the susceptor 12, the unbalance can be effectively canceled or corrected by the operation of the plasma density distribution controller 72. Further, as described above, the etching rate can also be improved.

Figure 8:
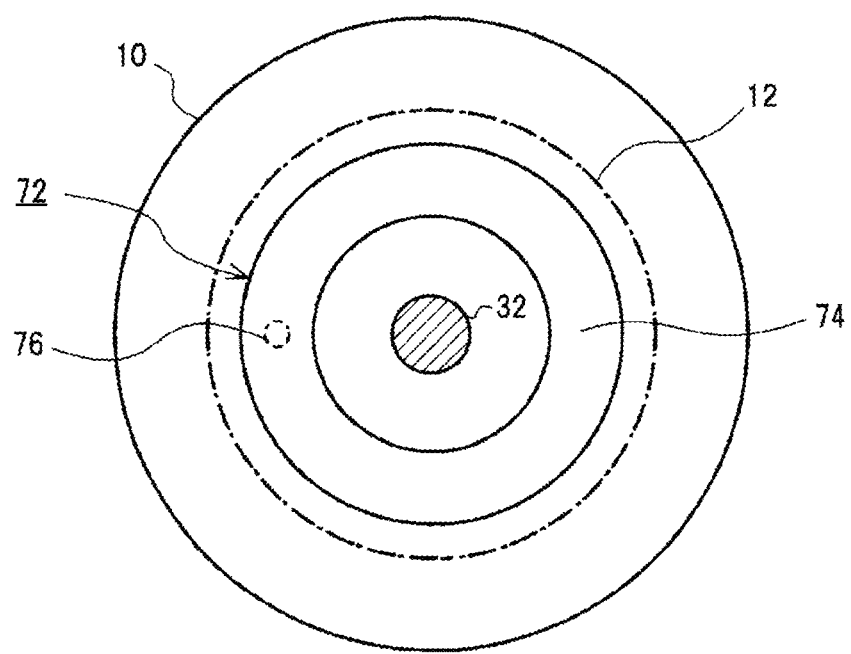
FIG. 8 is a plane view showing a main part of a modified example in the first embodiment.

FIG. 8 schematically shows a modified example of the plasma density distribution controller 72 in accordance with the first embodiment. In this configuration, the conductive plate 74 is formed in a circular ring shape around the power feed rod 32.

Figure 9:
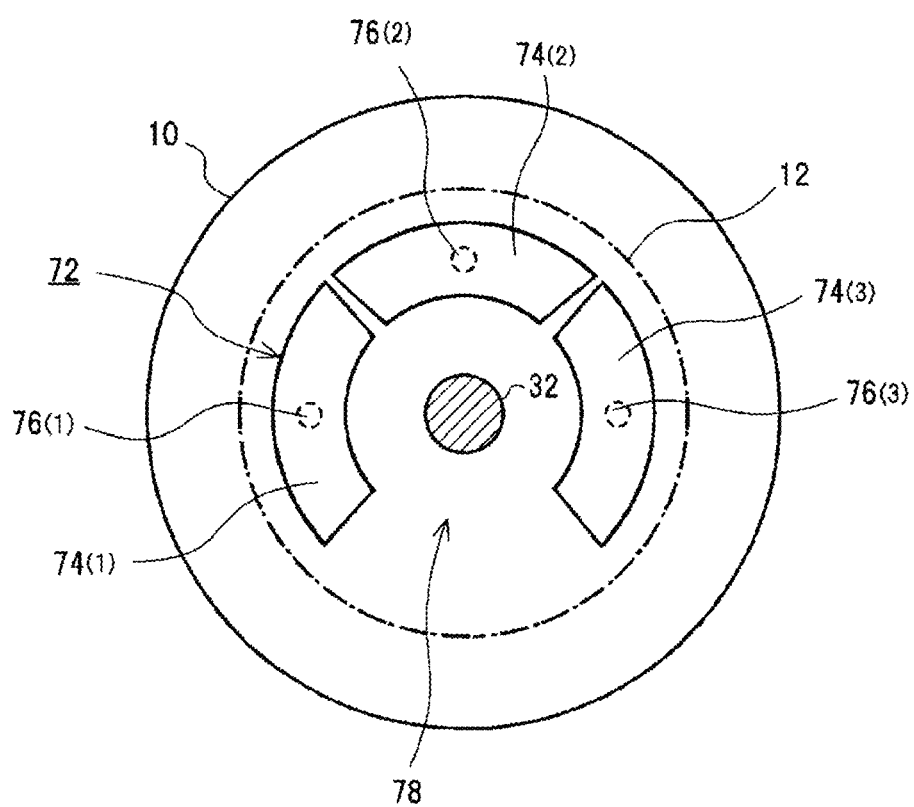
FIG. 9 is a plane view showing a main part of another modified example in the first embodiment.

FIG. 9 schematically shows another modified example of the first embodiment. In this configuration, a plurality of pairs (three pairs in the illustration) of the conductive plate 74 and the conductive rod 76 are installed in a circumference direction. In this case, a conductive plate 74(1) and a conductive rod 76(1) constitutes a first pair, a conductive plate 74(2) and a conductive rod 76(2) constitutes a second pair, and a conductive plate 74(3) and a conductive rod 76(3) constitutes a third pair.

These three conductive rods 76(1), 76(2), and 76(3) are equi-spaced (at about 90°) around a half-circumference (about 180°). The three conductive plates 74(1), 74(2), and 74(3) are separated from but closed to each other and they have their own heights (gaps) and form an empty space 78. This empty space 78 can be used for passing therethrough lines of a power supply system such as lines 48, 52 and 54 for cooling or a wire 44 (see FIG. 1).

Each operation of the first pair 74(1) and 76(1), the second pair 74(2) and 76(2), and the third pair 74(3) and 76(3) is electromagnetically combined. In this configuration, positions of the conductive rods 76(1), 76(2), and 76(3) each serving as a starting point of the operation are placed within a half-area (area of about 180°) in an azimuthal direction, so that it is possible to obtain the same effect as the single type as illustrated in FIG. 3A or 3B. That is, it is possible to provide intentional (controllable) unbalance to the distribution characteristics of the plasma density and the sheath electric field intensity on the susceptor 12 or the process characteristics on the semiconductor wafer W in a two-dimensional direction (particularly, in an azimuthal direction).

As can be seen from a layout of FIG. 9, the conductive plates 74(1), 74(2), and 74(3) can be configured to be connected with each other as one body or configured as a single conductive plate 74, or it is possible to appropriately change the positions of the conductive rods 76(1), 76(2), and 76(3).

Second Embodiment

In a second embodiment which is characteristically or developmentally modified from the layout of FIG. 9 in the first embodiment, a plurality of pairs of conductive rods 76(1), 76(2), . . . can be equi-spaced around a circumference (about 360°) in an azimuthal direction.

Figure 10:
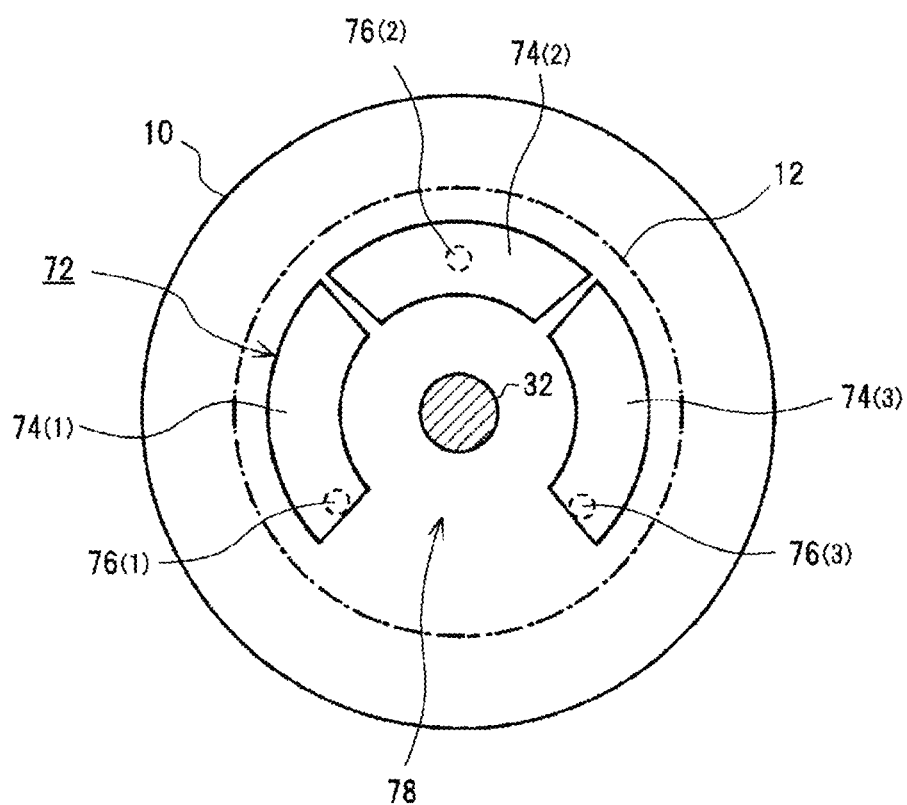
FIG. 10 is a plane view showing a schematic arrangement configuration (three-pair type) of a plasma density distribution controller in a two-dimensional direction in a second embodiment.
Figure 11:
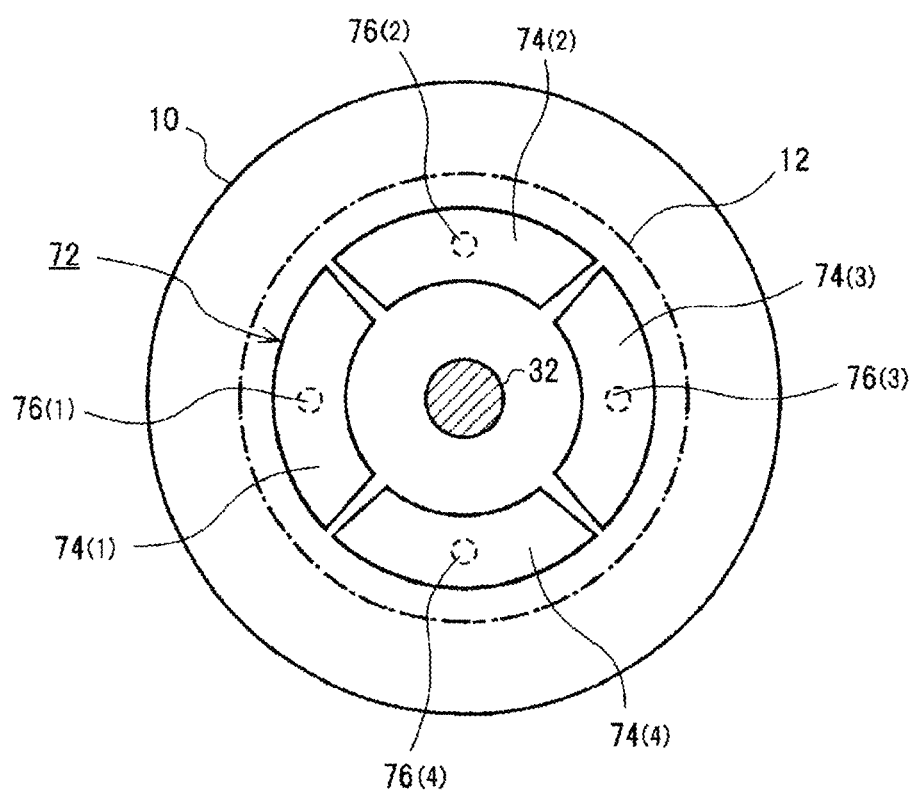
FIG. 11 is a plane view showing a schematic arrangement configuration (four-pair type) of a plasma density distribution controller in the two-dimensional direction in the second embodiment.

For example, in case of a three-pair type as illustrated in FIG. 10, three conductive rods 76(1), 76(2), and 76(3) are equi-spaced at about 120° around the power feed rod 32. In case of a four-pair type as illustrated in FIG. 11, four conductive rods 76(1), 76(2), 76(3), and 76(4) are equi-spaced at about 90° around the power feed rod 32.

Figure 12:
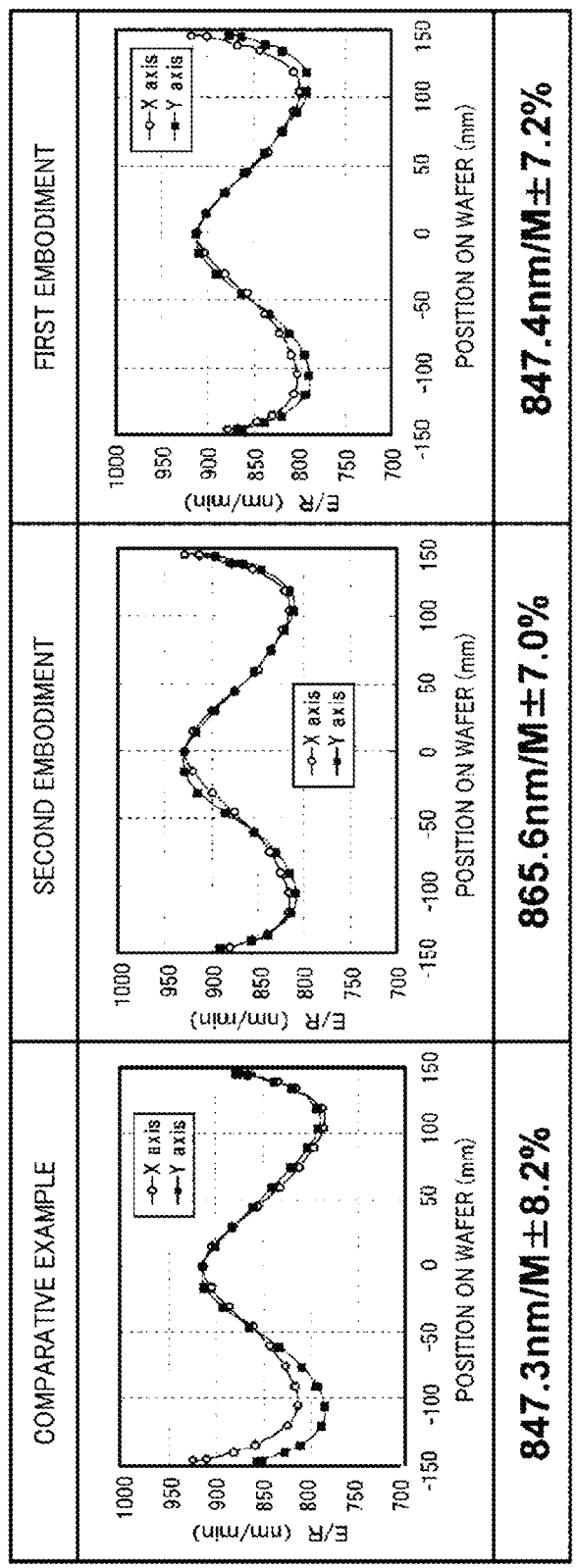
FIG. 12 is a view of etching rate distribution obtained by the second embodiment apparatus in the first experimental example as compared to that obtained by the comparative example apparatus and the first embodiment apparatus.

FIG. 12 shows etching rate distribution obtained by the plasma etching apparatus (second embodiment apparatus) shown in FIG. 1 including the plasma density distribution controller 72 (three-pair type of FIG. 10) in accordance with the second embodiment in the first experimental example (recipe A) as compared to etching rate distribution obtained by the comparative example apparatus and the first embodiment apparatus. Further, in the first embodiment apparatus, a gap size d is about 35 mm and in the second embodiment apparatus, a gap size d1 between the conductive plate 74(1) and the susceptor is about 17 mm, a gap size d2 between the conductive plate 74(2) and the susceptor is about 10 mm, and a gap size d3 between the conductive plate 74(3) and the susceptor is about 17 mm.

As shown in FIG. 12, as for the average of the etching rates and the in-plane uniformity, the second embodiment apparatus has about 865.6 nm/min±7.0% and is improved as compared to the comparative example apparatus (about 847.3 nm/min±8.2%) and the first embodiment apparatus (about 847.4 nm/min±7.2%).

In the second embodiment apparatus, the conductive rods 76(1), 76(2), . . . each serving as a starting point of the operation of the plasma density distribution controller 72 are equi-spaced around the circumference, whereby the plasma density distribution characteristics on the susceptor 12 or the process characteristics on the semiconductor wafer W is not arbitrarily biased. Instead, unbalance caused by asymmetry in the apparatus configuration is suppressed or corrected by force or balance maintaining power for making these characteristics uniform.

Figure 13:
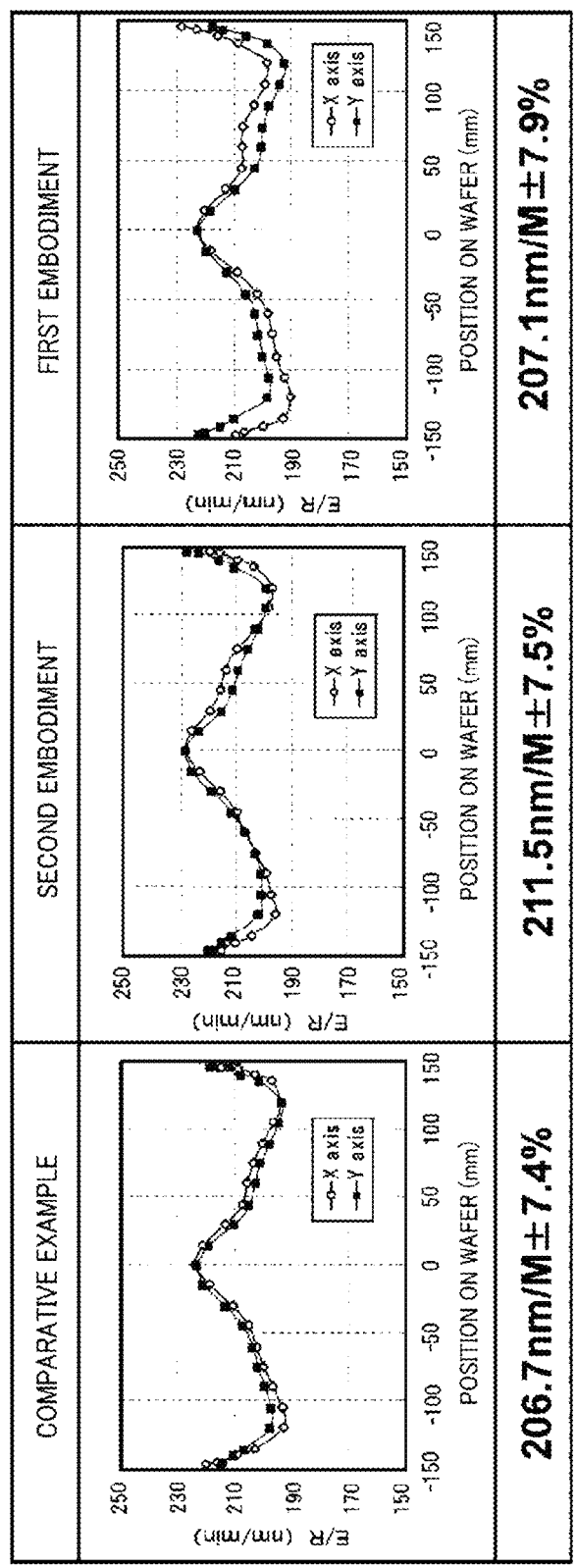
FIG. 13 is a view showing etching rate distribution obtained by the comparative example apparatus, the first embodiment apparatus, and the second embodiment apparatus in the second experimental example based on a different recipe.

As a second experimental example, FIG. 13 shows etching rate distribution obtained by performing a plasma etching process based on another preset recipe (hereinafter, referred to as "recipe B") in the comparative example apparatus, the first embodiment apparatus, and the second embodiment apparatus, respectively.

As illustrated in FIG. 13, in case of the recipe B, the in-plane uniformity of the etching rate of the second embodiment apparatus is ±7.5% which is hardly changed as compared to the comparative example apparatus (±7.4%), but the average is about 211.5 nm/min which is improved as compared to the comparative example apparatus (about 206.7 nm/min). The average of the etching rates of the first embodiment apparatus is about 207.1 nm/min which is hardly changed as compared to the comparative example apparatus (about 206.7 nm/min), but the in-plane uniformity is ±7.9% which is deteriorated as compared to the comparative example apparatus (±7.4%).

As described above, the second embodiment apparatus is capable of performing any process recipe with the respective units of the plasma density distribution controller 72 fixed, and, thus, the second embodiment apparatus can be widely used. However, the first embodiment apparatus requires adjustment (e.g., position adjustment or layout adjustment of the conductive plate 74 and/or the conductive rod 76) for each process recipe for the sake of optimization.

Other Embodiments here have been explained basic configurations and effects of the plasma density distribution controller 72 installed in the plasma etching apparatus with reference to FIGS. 1 to 13. However, the plasma density distribution controller 72 can be modified, expanded or applied based on a technical conception of the present disclosure.

Figure 14A:
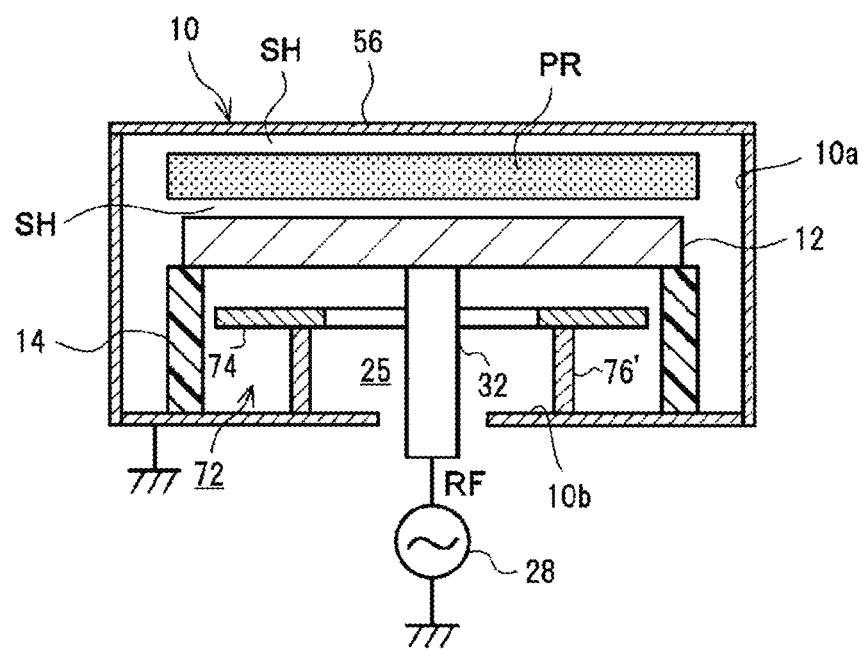
FIG. 14A is a longitudinal cross-sectional view of a configuration of a main part of a plasma density distribution controller in accordance with an embodiment.
Figure 14B:
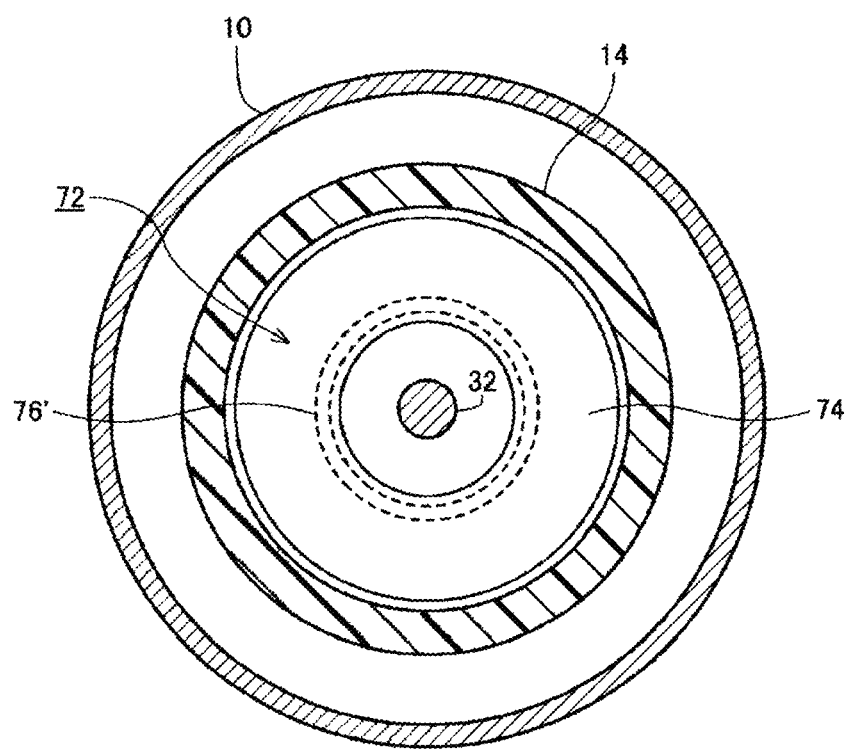
FIG. 14B is a transversal cross-sectional view of a two-dimensional layout of the main part of the embodiment (in FIG. 14A)

For example, as illustrated in FIGS. 14A and 14B, a plasma density distribution controller 72 may include a conductive plate 74 formed in a circular ring shape as a first conductor, and a conductive plate (not illustrated) or a cylindrical conductor 76' as a second conductor instead of the conductive rod 76.

In the illustrated configuration, the cylindrical conductor 76' is installed to surround the power feed rod 32, and its upper end surface (first connecting portion) is connected with a bottom surface of the ring-shaped conductive plate 74 and its lower end surface (second connecting portion) is fixed to or is in contact with the bottom wall 10b of the chamber. A configuration of each unit such as an inner diameter, an outer diameter, a height position of the ring-shaped conductive plate 74, and a diameter and a thickness of the cylindrical conductor 76' can be arbitrarily selected.

Figure 15A:
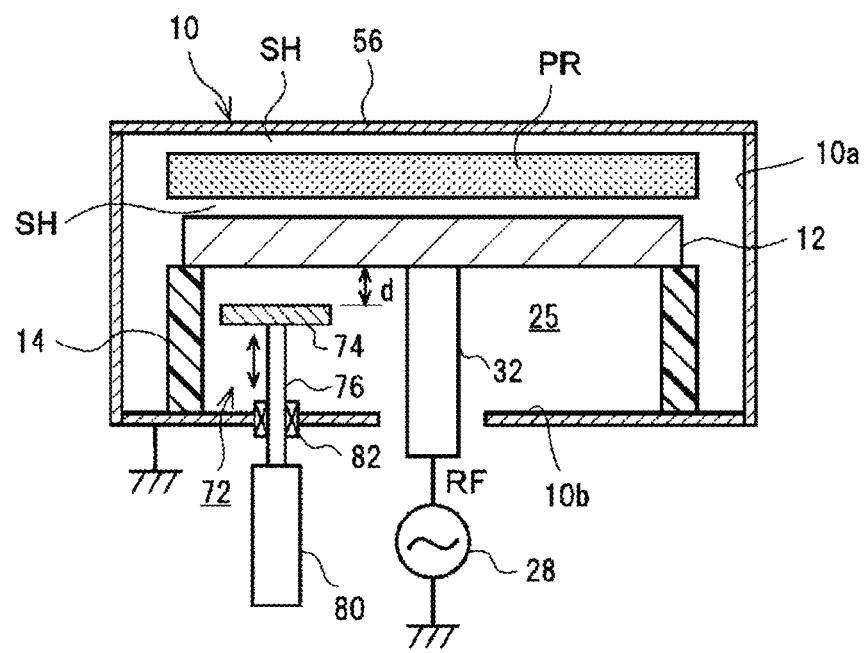
FIG. 15A is a longitudinal cross-sectional view of a configuration of a main part of a plasma density distribution controller in accordance with an embodiment.
Figure 15B:
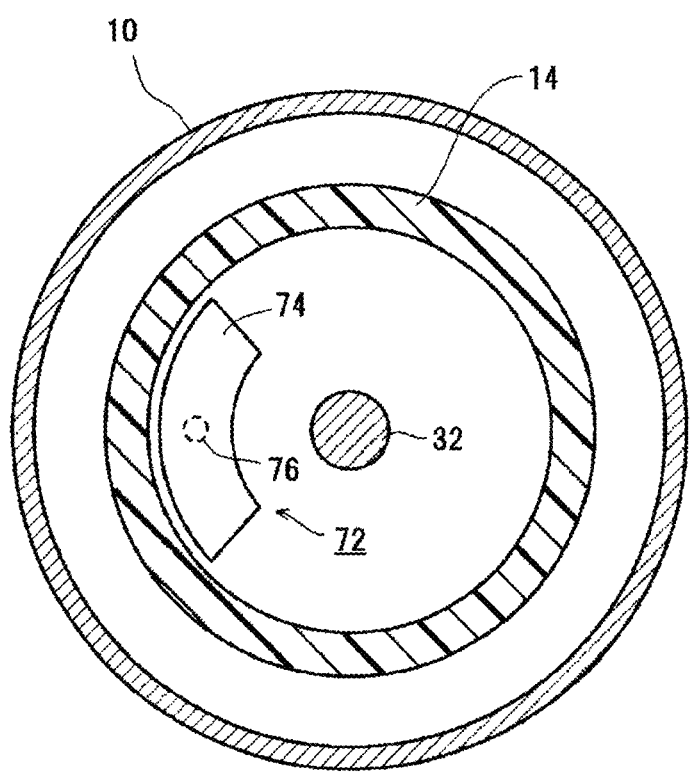
FIG. 15B is a transversal cross-sectional view of a two-dimensional layout of the main part of the embodiment (in FIG. 15A)

As depicted in FIGS. 15A and 15B, the plasma density distribution controller 72 may include an elevating mechanism 80 for variably adjusting height positions (or a gap size d) of the conductive plate 74 and the conductive rod 76. The elevating mechanism 80 includes, e.g., an air cylinder or an electric actuator and is operated under the control of the controller 70 (see FIG. 1). The conductive rod 76 passes through a hole formed in the bottom wall 10b of the chamber 10 and is connected with the outside elevating mechanism 80. At the thorough hole formed in the bottom wall 10b of the chamber, a conductive slide bearing 82 for slidably supporting the middle and lower portions of the conductive rod 76. A top surface of the conductive plate 74 is capacitively coupled and electrically connected with the rear surface of the susceptor 12 with respect to the high frequency (RF) power and its bottom surface is electrically connected with the bottom wall 10b (conductive grounding member) of the chamber via the conductive rod 76 and the slide bearing 82.

Figure 16A:
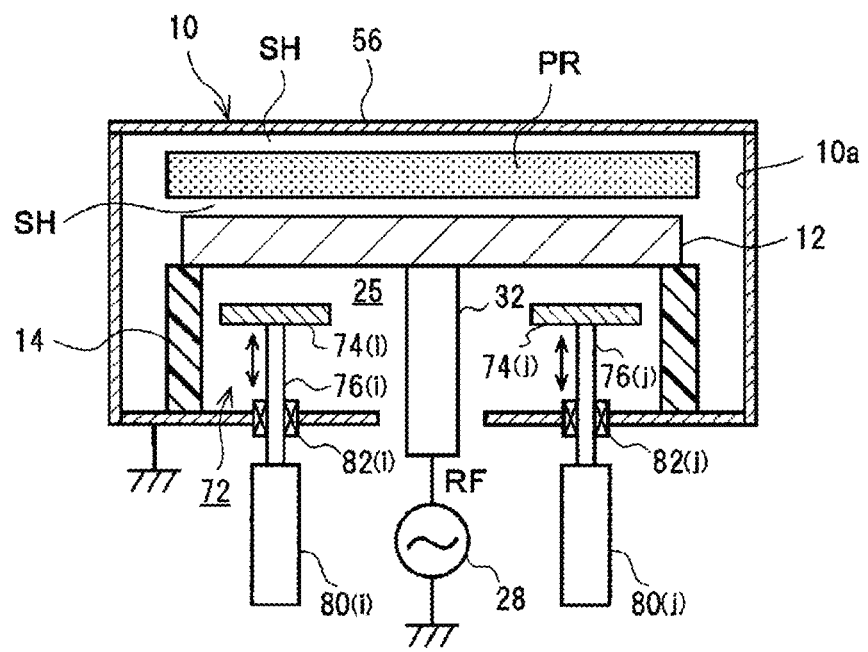
FIG. 16A is a longitudinal cross-sectional view of a configuration of a main part of a plasma density distribution controller in accordance with an embodiment.
Figure 16B:
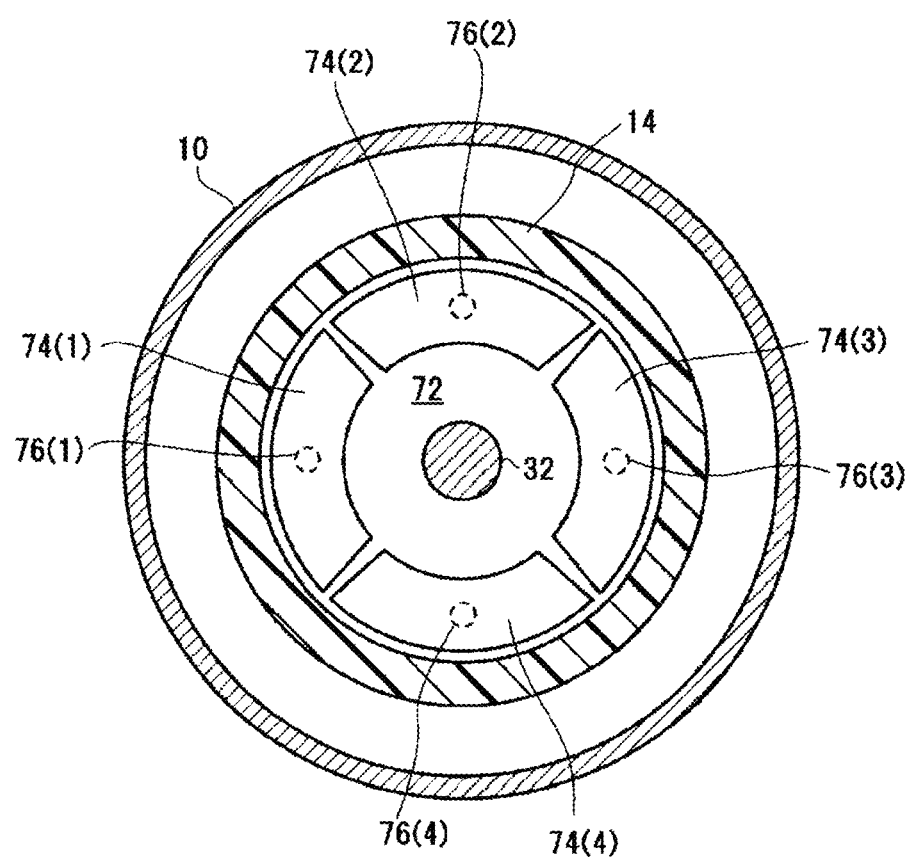
FIG. 16B is a transversal cross-sectional view of a two-dimensional layout of the main part of the embodiment (in FIG. 16A)

The above-stated plasma density distribution controller 72 including the elevating mechanism 80 can be applied not only to the first embodiment apparatus but also to the second embodiment apparatus (a four-pair type) as depicted in FIGS. 16A and 16B.

Figure 17A:
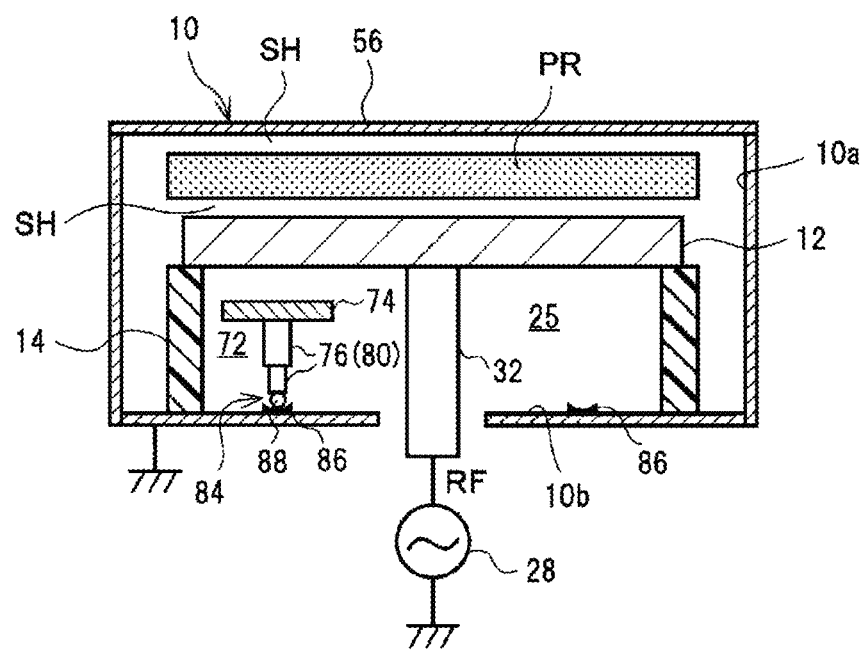
FIG. 17A is a longitudinal cross-sectional view of a configuration of a main part of a plasma density distribution controller in accordance with an embodiment.
Figure 17B:
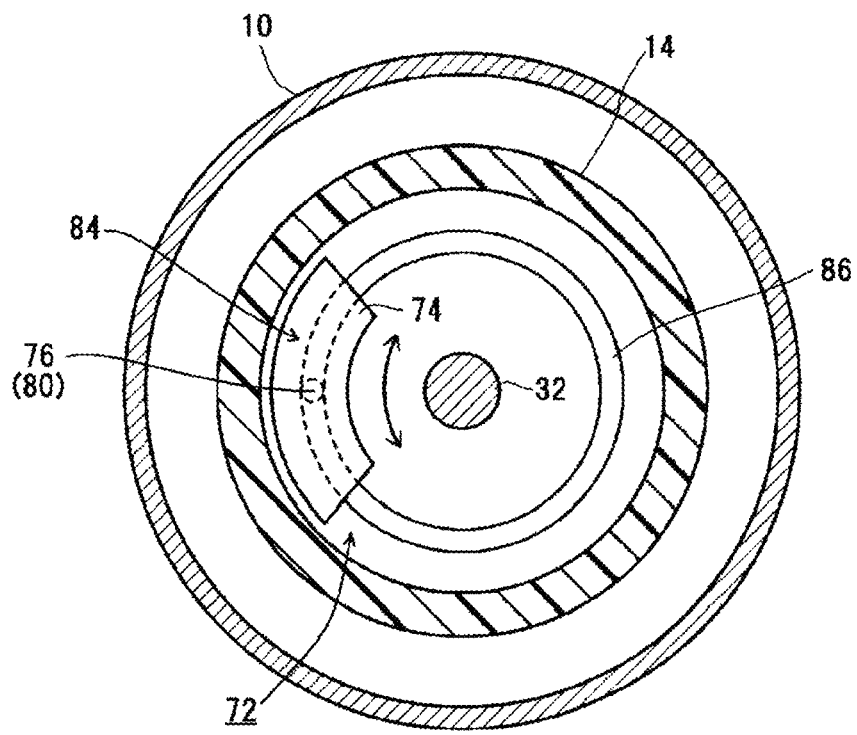
FIG. 17B a transversal cross-sectional view of a two-dimensional layout of the main part of the embodiment (in FIG. 17A)

In a plasma density distribution controller 72 illustrated in FIGS. 17A and 17B, a conductive plate 74 and a conductive rod 76 are rotationally moved as one unit along an azimuthal direction around the power feed rod 32 in the first embodiment apparatus. A rotation unit 84 for rotationally moving the conductive plate 74 and the conductive rod 76 is installed within or around the chamber lower room 25.

For example, as depicted in FIGS. 17A and 17B, the rotation unit 84 includes a ring-shaped guide rail 86 installed at the bottom wall 10b of the chamber 10 and a rotation roller (or ball) 88 installed at an lower end of a rotation rod 76 so as to move the rotation roller 88 on the ring-shaped guide rail 86. In this case, the conductive rod 76 can be configured as, e.g., a small-sized air cylinder, and the elevating mechanism 80 can be installed within the chamber lower room 25.

Figure 18A:
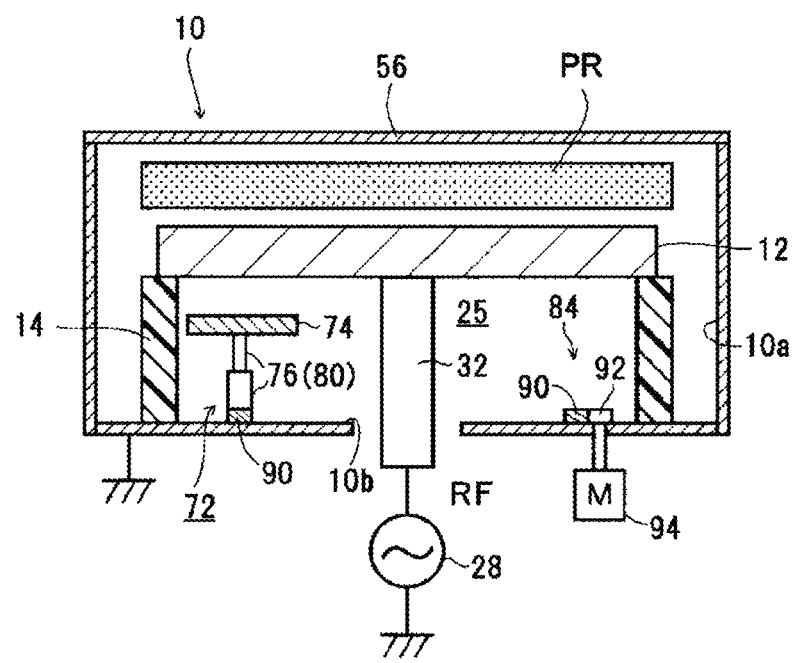
FIG. 18A is a longitudinal cross-sectional view of a configuration of a main part of a plasma density distribution controller in accordance with an embodiment.
Figure 18B:
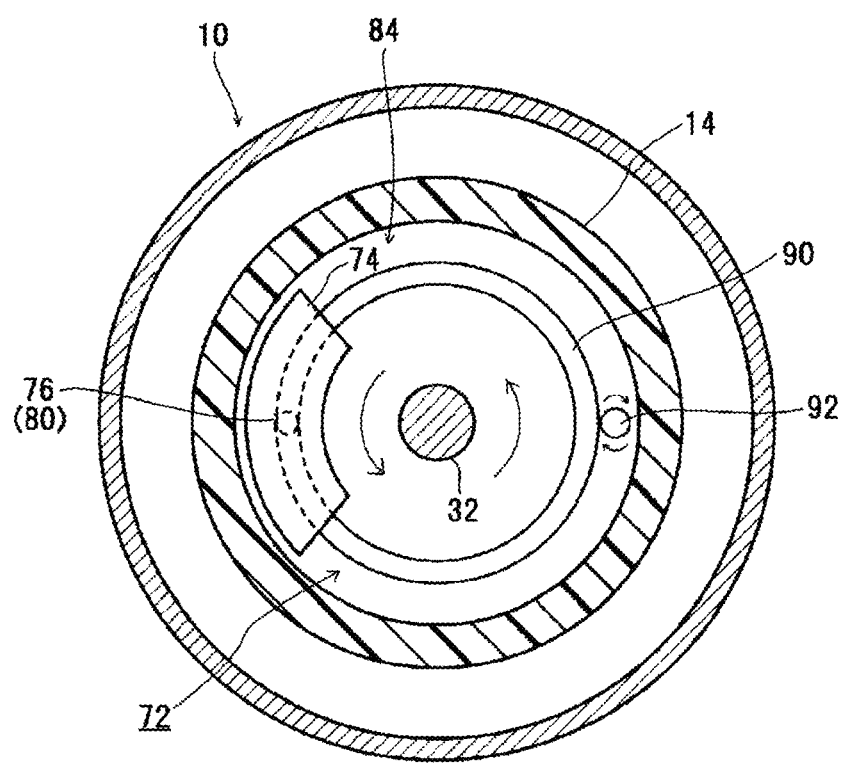
FIG. 18B is a transversal cross-sectional view of a two-dimensional layout of the main part of the embodiment (in FIG. 18A)

Further, as depicted in FIGS. 18A and 18B, as a rotation unit 84, a spur gear 90 can be installed on the bottom wall 10b of the chamber 10 so as to be horizontally rotated. The spur gear 90 is connected with a motor 94 via a gear 92, and the conductive plate 74 and the conductive rod 76 are fixed onto the spur gear 90. In this case, by rotating the spur gear 90 by a rotational driving force of the motor 94, the conductive plate 74 and the conductive rod 76 can be rotationally moved to a certain angular position or rotationally moved continuously at a constant speed. The top surface of the conductive plate 74 is capacitively coupled and electrically connected with the rear surface of the susceptor 12 with respect to the high frequency (RF) power and its bottom surface is electrically connected with the bottom wall 10b (conductive grounding member) of the chamber via the conductive rod 76 and the spur gear 90.

If the conductive plate 74 and the conductive rod 76 are rotationally moved at a constant speed during a plasma etching process, sheath electric field intensity distribution represented by a sine curve as illustrated in FIG. 6 can be moved in an azimuthal direction, so that the sheath electric field intensity distribution can be uniformized not only in an azimuthal direction but also in a diametrical direction. Accordingly, by making sheath electric field intensity distribution, plasma density distribution, and process characteristics uniform by force, unbalance caused by asymmetry in the apparatus configuration is effectively suppressed in the same manner as or better manner than the second embodiment apparatus. Further, distribution of plasma density on the susceptor 12 can be more effectively made to be uniform, so that an in-plane difference in process characteristics on the semiconductor wafer W can be more effectively reduced.

Further, in the second embodiment apparatus, the plasma density distribution controller 72 may have the above-described rotation function.

Figure 19A:
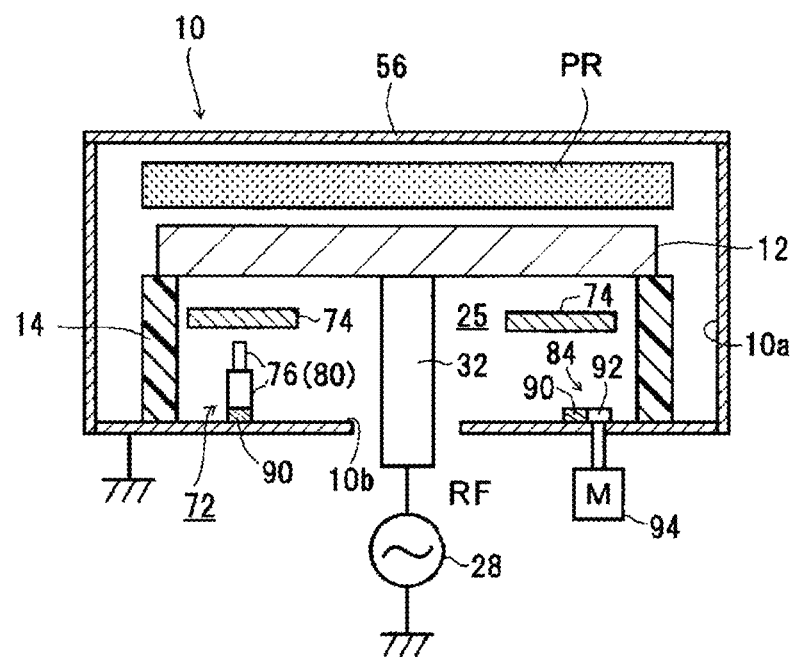
FIG. 19A is a longitudinal cross-sectional view of a configuration of a main part of a plasma density distribution controller in accordance with an embodiment.
Figure 19B:
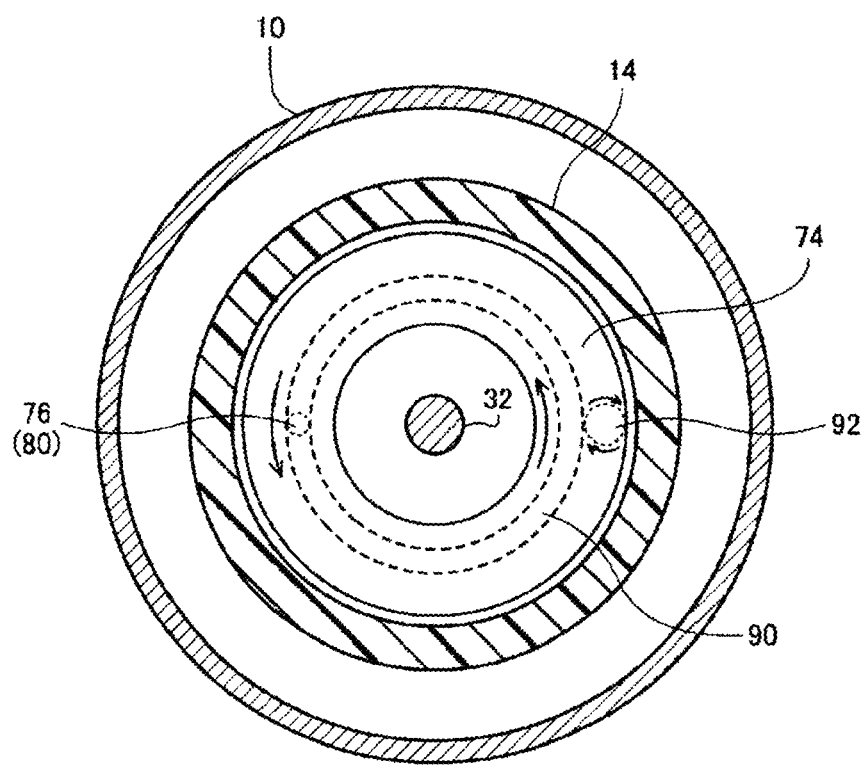
FIG. 19B is a transversal cross-sectional view of a two-dimensional layout of the main part of the embodiment (in FIG. 19A)

As a modified example of the rotation function, as illustrated in FIGS. 19A and 19B, a conductive plate 74 and a conductive rod 76 are separated from each other, the conductive plate 74 is fixed to a desired height position by an insulating supporting member (not illustrated) instead of the rotation rod 76. Further, only the conductive rod 76 can be mounted on a spur gear 90 and rotationally moved. In this case, the bottom surface of the conductive plate 74 is capacitively coupled and electrically connected with the upper end (first connecting portion) of the conductive rod 76 with respect to a high frequency (RF) power.

Further, it may be possible to provide a conductor moving unit (not illustrated) for moving the conductive plate 74 and the conductive rod 76 as one body, or for moving only the conductive rod 76 in a diametrical direction with the conductive plate 76 fixed.

Figure 20:
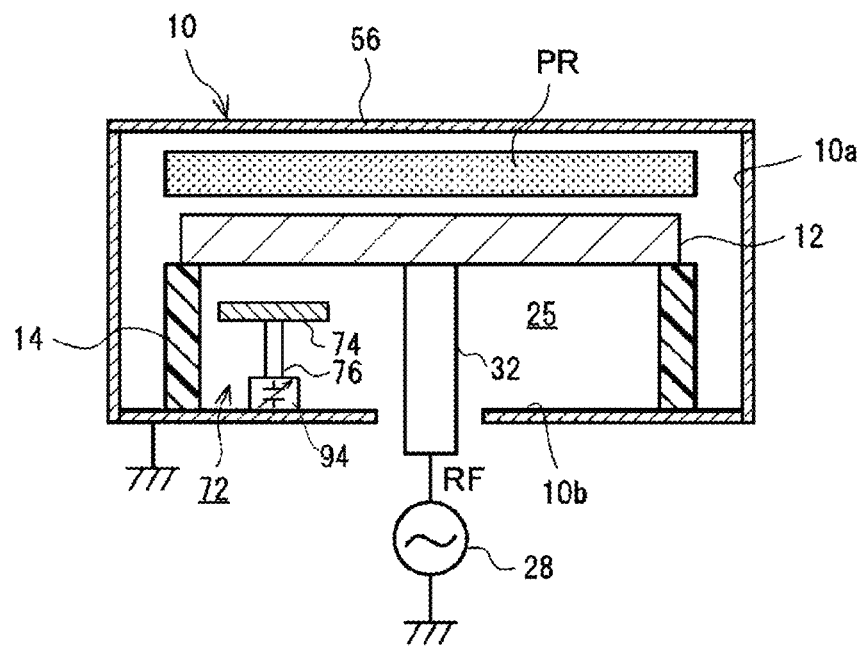
FIG. 20 is a longitudinal cross-sectional view of a configuration of a main part of a plasma density distribution controller in accordance with an embodiment.

FIG. 20 illustrates a configuration example of a plasma density distribution controller 72 in which a lower end (second connecting portion) of a conductive rod 76 is electrically connected with the bottom wall 10b (grounding member) of the chamber via a variable capacitor 94.

Figure 21:
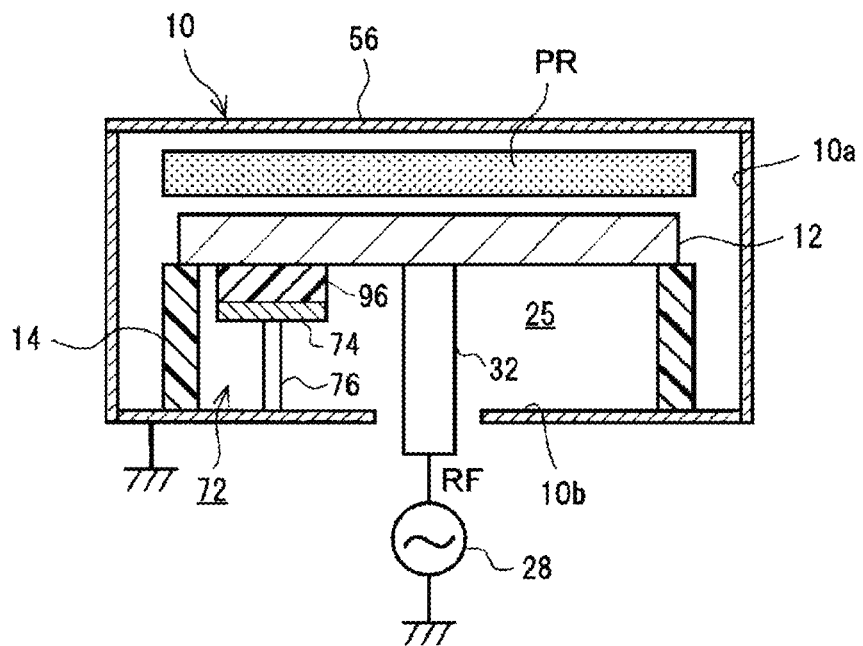
FIG. 21 is a longitudinal cross-sectional view of a configuration of a main part of a plasma density distribution controller in accordance with an embodiment.

FIG. 21 illustrates a configuration example in which a dielectric member 96 is inserted between the conductive plate 74 and the rear surface of the susceptor 12. If the dielectric member 96 is made of, e.g., ceramic, a dielectric constant is increased about 9 times as that in a gap, so that the effect of the plasma density distribution controller 72 can be strong. Further, it is advantageous that abnormal electric discharge can be prevented.

Figure 22:
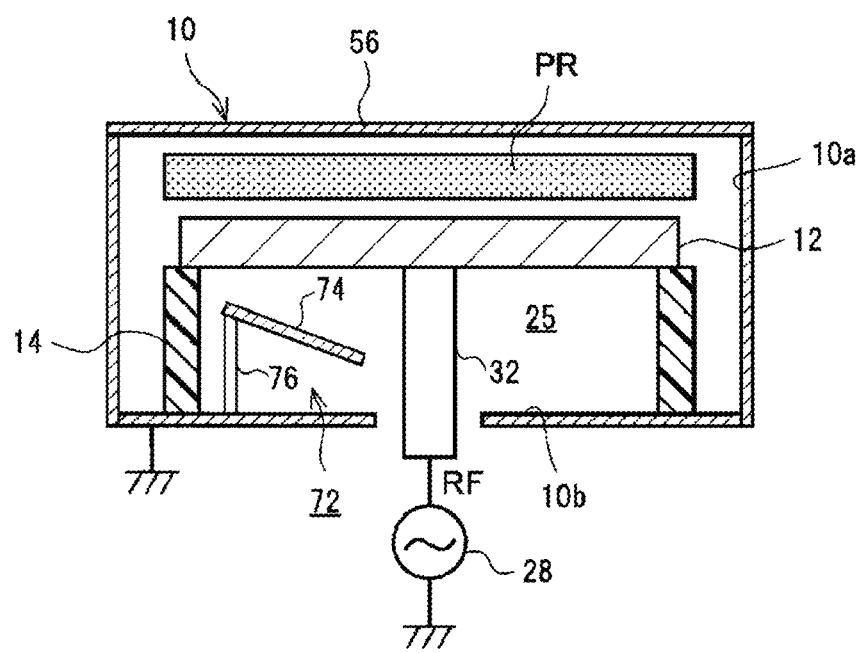
FIG. 22 is a longitudinal cross-sectional view of a configuration of a main part of a plasma density distribution controller in accordance with an embodiment.

FIG. 22 illustrates a configuration example showing that the conductive plate 74 is installed not to be horizontal but to be inclined at a certain inclination angle. In the configuration example, the conductive plate 74 is inclined in a diametrical direction, but it may be inclined in an azimuthal direction. As illustrated, if the highest point of the top surface of the conductive plate 74 is at the position of the upper end (first connecting member) of the conductive rod 76, electric field intensity (minimum value) at a starting point can be relatively weaker in the electric field intensity distribution on the conductive plate 74.

Figure 23:
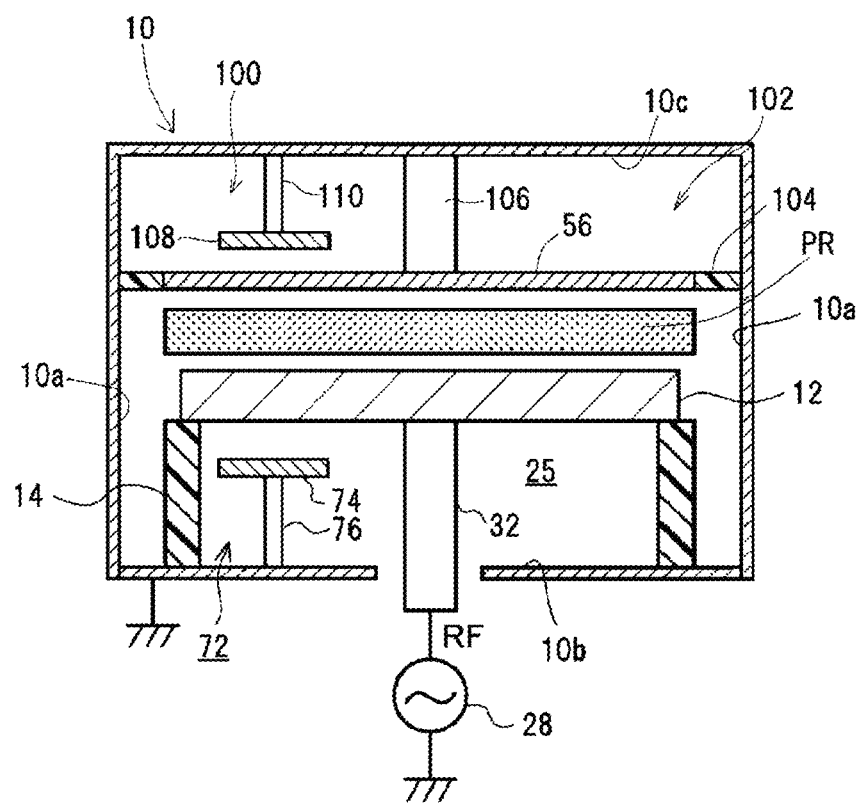
FIG. 23 is a longitudinal cross-sectional view of a configuration of a main part of a plasma density distribution controller in accordance with an embodiment.

FIG. 23 illustrates a configuration example showing that, in the plasma etching apparatus of a cathode-couple type as shown in FIG. 1, the plasma density distribution controller 72 is installed at the rear of the susceptor 12, i.e., within the chamber lower room 25 and another plasma distribution density controller 100 having the same configuration or function as the plasma density distribution controller 72 is installed at the rear side of the upper electrode 56, i.e., within a chamber ceiling room 102.

In FIG. 23, the upper electrode 56 is installed at a ceiling surface of the chamber 10 via a ring-shaped insulating member 104. The chamber side wall 10a extends upwardly higher than the chamber ceiling surface and its upper end is connected with an outer peripheral portion of a chamber ceiling plate 10c, thereby forming the chamber ceiling room 102. Further, a central conductive rod 106 is positioned between a rear central portion of the upper electrode 56 and the chamber ceiling plate 10c.

The upper plasma density distribution controller 100 is installed at a position distanced away from the central conductive rod 106 and includes a conductive plate (first conductor) 108, of which a bottom surface is parallel (or inclined) to face a desired portion of the rear surface of the upper electrode 56, and a conductive rod (second conductor) 110 which supports the conductive plate 108 from the top and is electrically grounded. A lower end (first connecting portion) of the conductive rod 110 is electrically connected with a certain portion on a top surface of the conductive plate 108. An upper end (second connecting portion) of the conductive rod 110 is fixed to or is in contact with the chamber ceiling plate 10c.

In the upper plasma density distribution controller 100 configured as stated above, the conductive plate 108 is capacitively coupled and electrically connected with the rear surface of the upper electrode 56 positioned right below the conductive plate 108, with respect to a high frequency (RF) power applied to the susceptor 12 from the high-frequency power supply 28. Further, the upper end (second connecting portion) of the conductive rod 110 is electrically connected with the chamber ceiling plate 10c (conductive grounding member).

Some of high-frequency current introduced from the susceptor 12 to the upper electrode 56 via the plasma PR returns to the chamber 10 at a ground potential through the central conductive rod 106, and the other returns to the chamber 10 at the ground potential through the upper plasma density distribution controller 100. By adjusting a ratio of the high-frequency current passing through the upper plasma density distribution controller 100, it is possible to control distribution of the plasma density right below the upper electrode 56.

The above-described configuration examples illustrated in FIGS. 20 to 23 can be applied to both the first embodiment apparatus and the second embodiment apparatus.

Figure 24A:
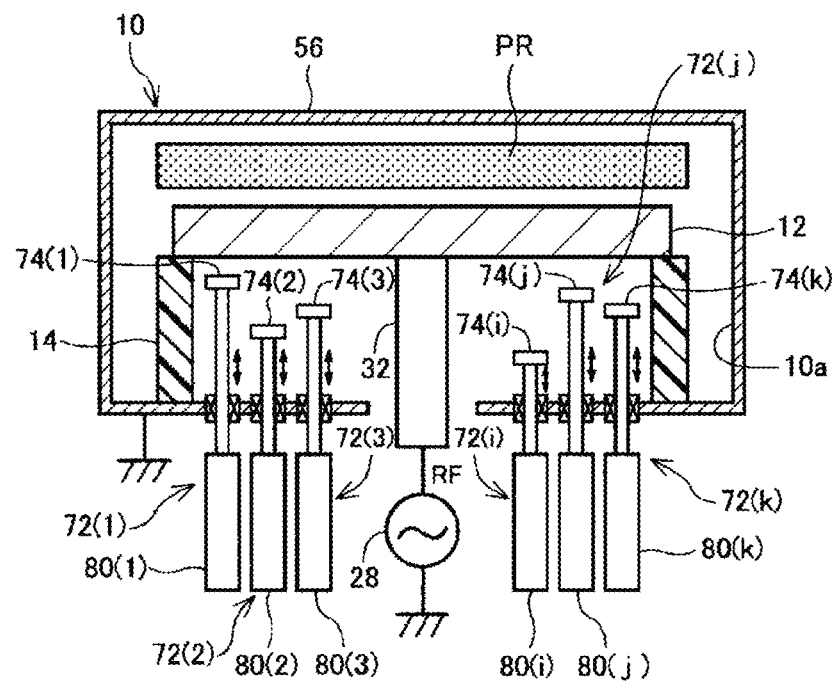
FIG. 24A is a longitudinal cross-sectional view of a configuration of a main part of a plasma density distribution controller in accordance with an embodiment.
Figure 24B:
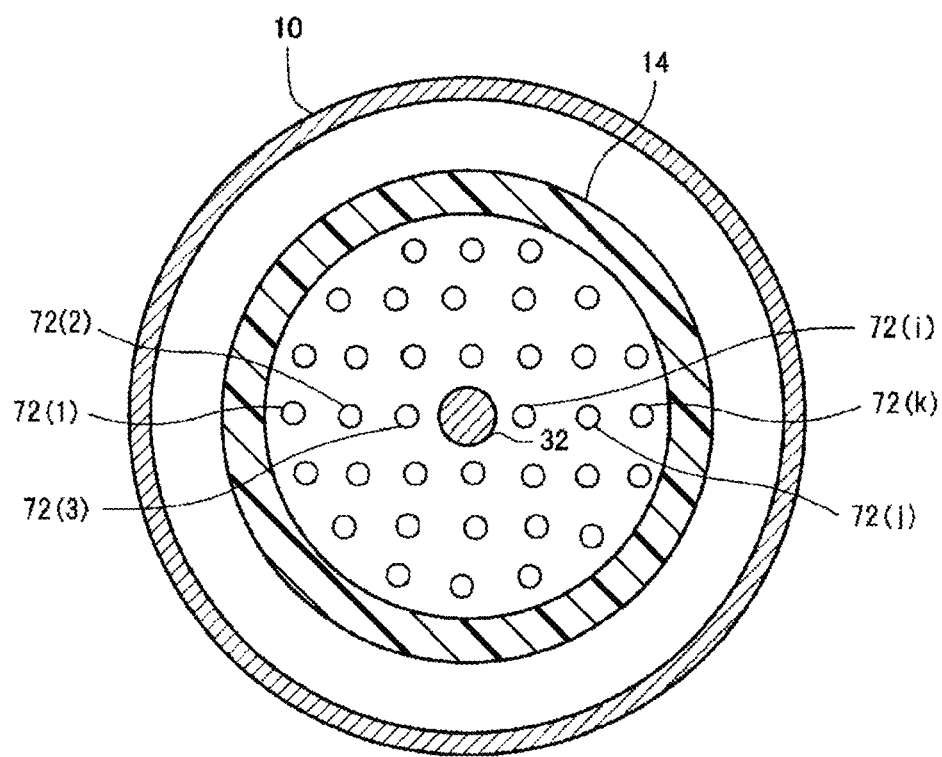
FIG. 24B is a partial cross-sectional plane view of a two-dimensional layout of the main part of the embodiment (in FIG. 24A)

FIGS. 24A and 24B provide a modified example of the configuration example illustrated in FIG. 15A, in which a plurality of elevating plasma density distribution control units 72(n) including conductive plates 74(n), conductive rods 76(n), and elevating mechanisms 80(n) is installed in a two-dimensional direction. Here, n can be 1, 2, 3, . . . . Each unit 72(n) moves up and down independently from each other, whereby a gap on each conductive plate 74(n) can be independently varied.

Figure 25A:
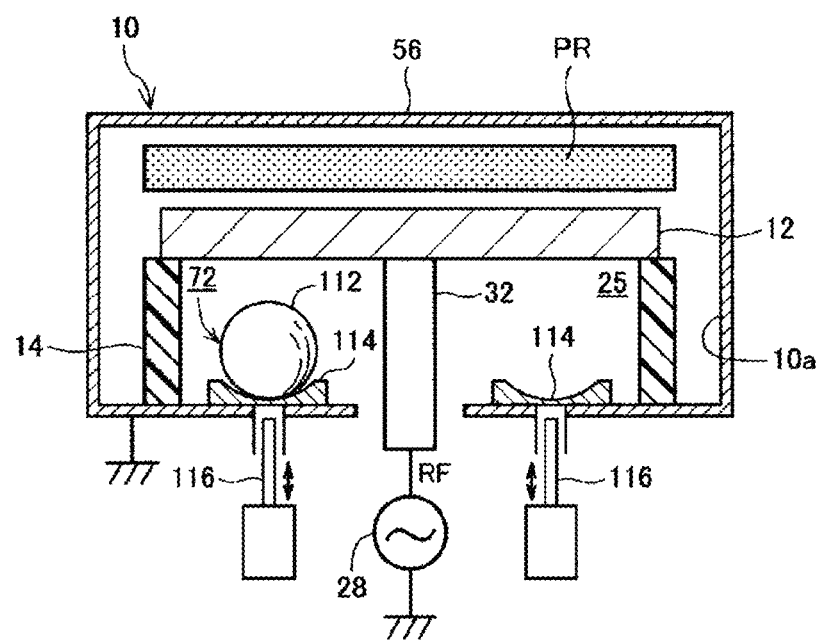
FIG. 25A is a longitudinal cross-sectional view of a configuration of a main part of a plasma density distribution controller in accordance with an embodiment.
Figure 25B:
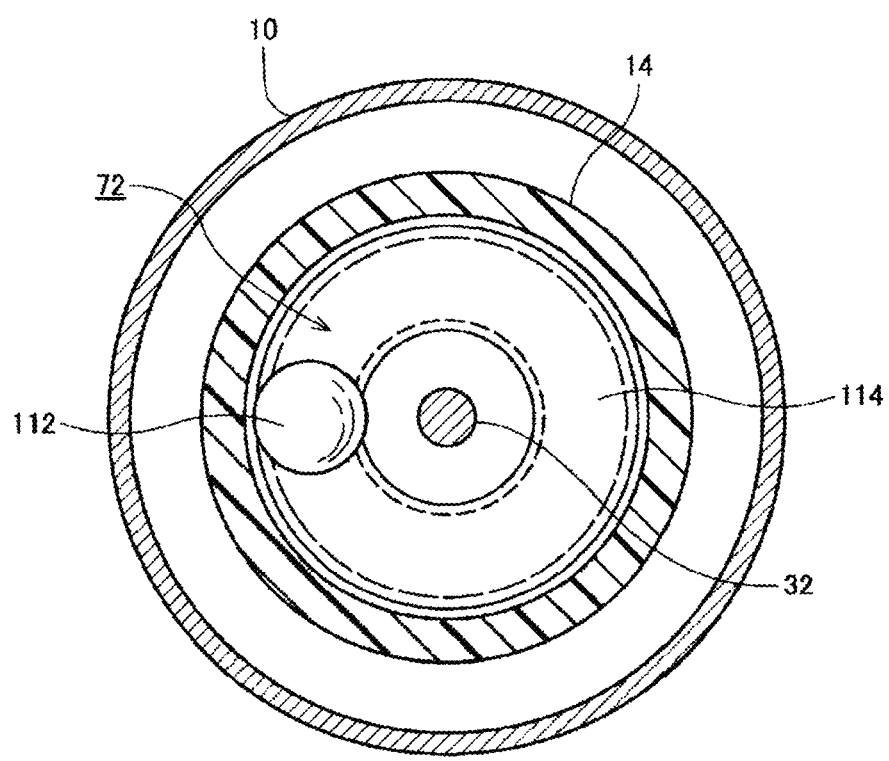
FIG. 25B is a partial cross-sectional plane view of a two-dimensional layout of the main part of the embodiment (in FIG. 25A)

FIGS. 25A and 25B provide a configuration example showing that a conductive ball 112 serves as a first and a second conductor 74 and 76. In this case, a ring-shaped rail 114 on which the conductive ball 112 is rolled is installed at the chamber's bottom wall 10b. The ring-shaped rail 114 is locally lifted up from the bottom by, e.g., lift pins 116 provided in several places so as to slightly incline the whole rail 114, so that a position of the conductive ball 112 can be varied or adjusted in an azimuthal direction.

Figure 26A:
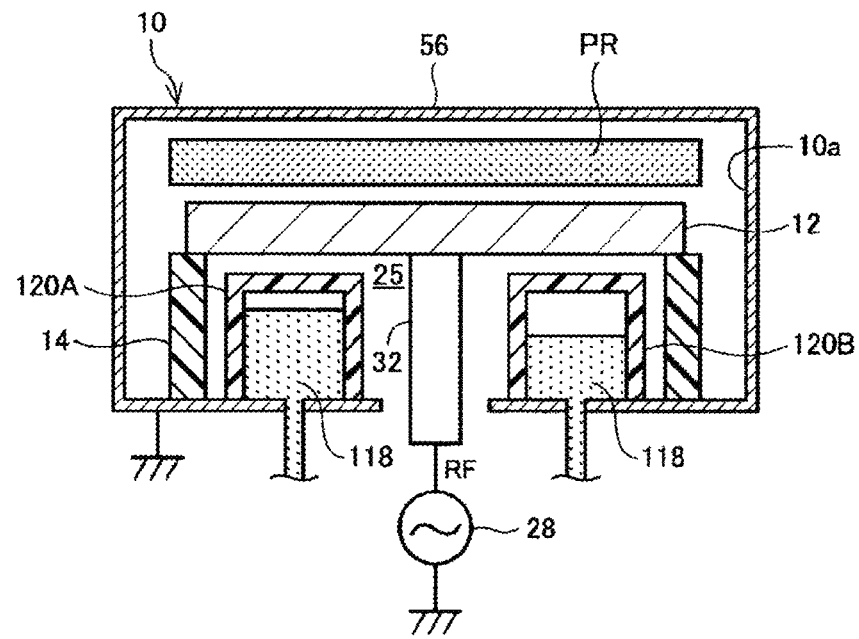
FIG. 26A is a longitudinal cross-sectional view of a configuration of a main part of a plasma density distribution controller in accordance with an embodiment.
Figure 26B:
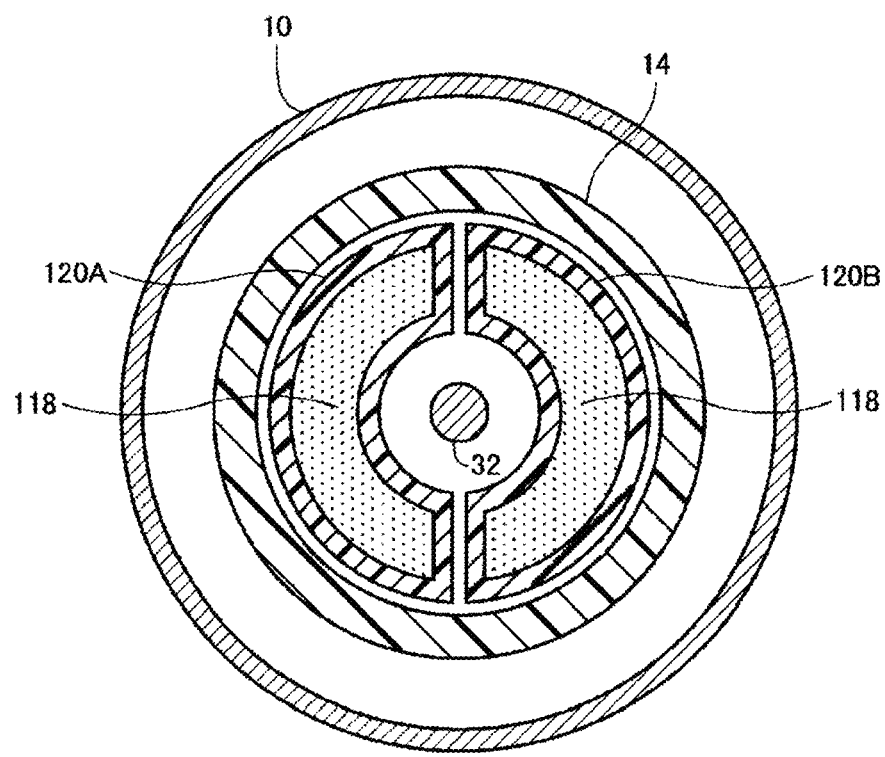
FIG. 26B is a transversal cross-sectional view of a two-dimensional layout of the main part of the embodiment (in FIG. 26A)

FIGS. 26A and 26B provide a configuration example showing that fluid metal 118 such as liquid metal or petrochemical metal powder serves as a first and a second conductor 74 and 76. In this case, a plurality of (e.g., two) circular arc-shaped fluid metal rooms 120A and 120B made of an insulating material may be installed within the chamber lower room 25. The volume or a liquid surface height of the fluid metal 118 inside the fluid metal rooms 120A and 120B may be adjusted respectively by a pump (not illustrated) or the like.

Figure 27A:
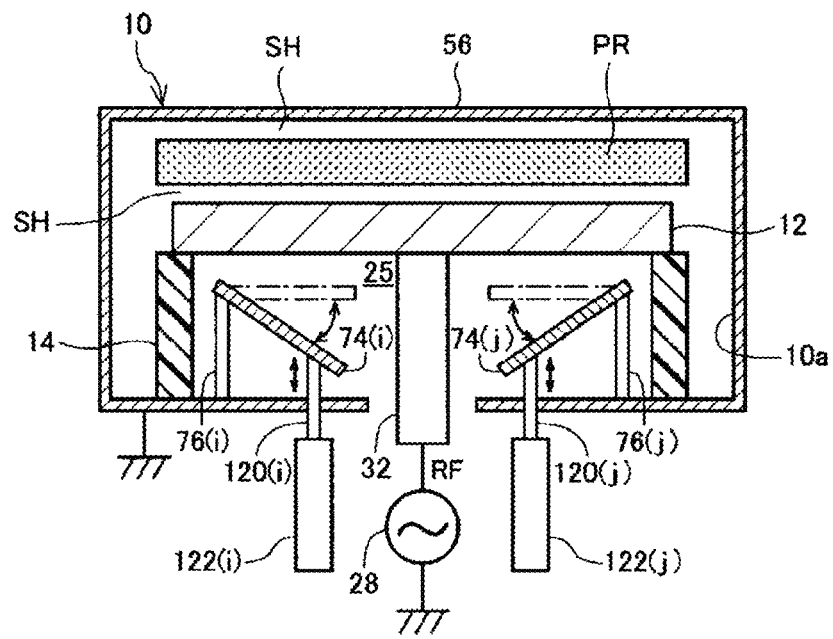
FIG. 27A is a longitudinal cross-sectional view of a configuration of a main part of a plasma density distribution controller in accordance with an embodiment.
Figure 27B:
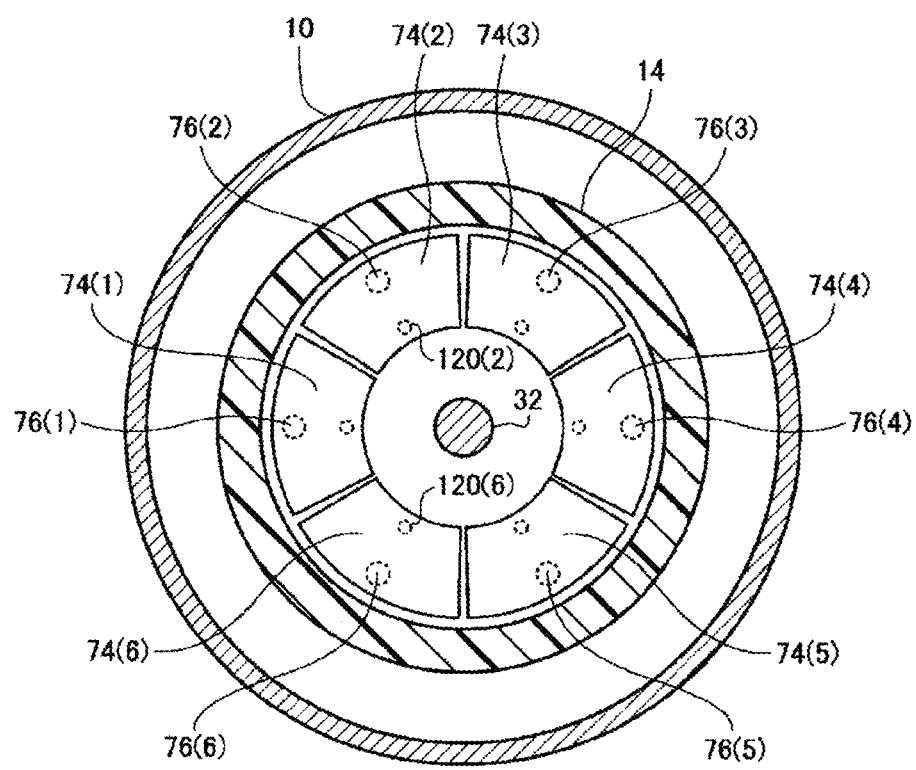
FIG. 27B is a transversal cross-sectional view of a two-dimensional layout of the main part of the embodiment (in FIG. 27A)

FIGS. 27A and 27B illustrate a configuration example showing that the conductive plate 74 serves as a shutter blade. In the illustrated example, 6 sheets of blades are provided, and each blade, i.e., conductive plate 74(n), is configured such that an outer peripheral end is supported by a conductive rod 76(n) and an inner peripheral end is moved up and down by an actuator 122(n) via an insulating lift pin 120(n), thereby opening and closing a shutter.

Figure 28A:
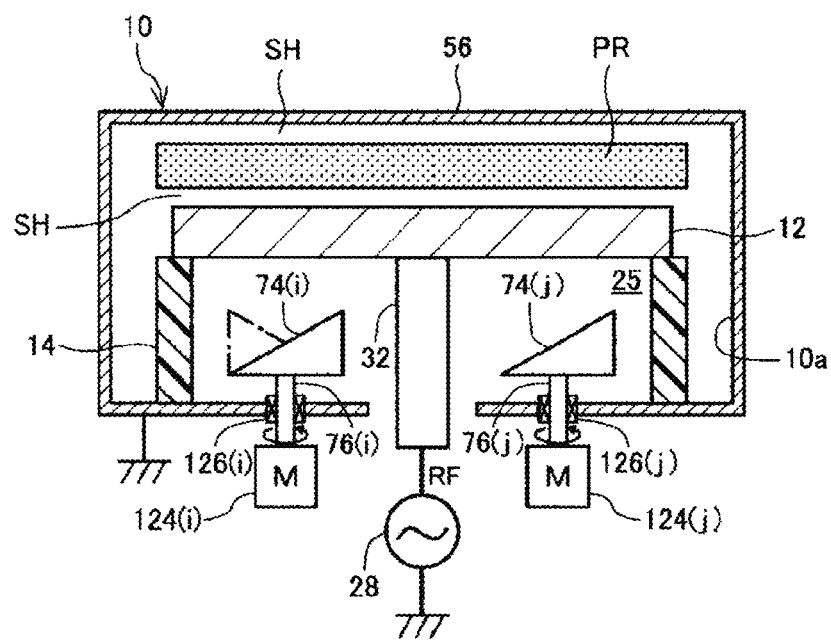
FIG. 28A is a longitudinal cross-sectional view of a configuration of a main part of a plasma density distribution controller in accordance with an embodiment.
Figure 28B:
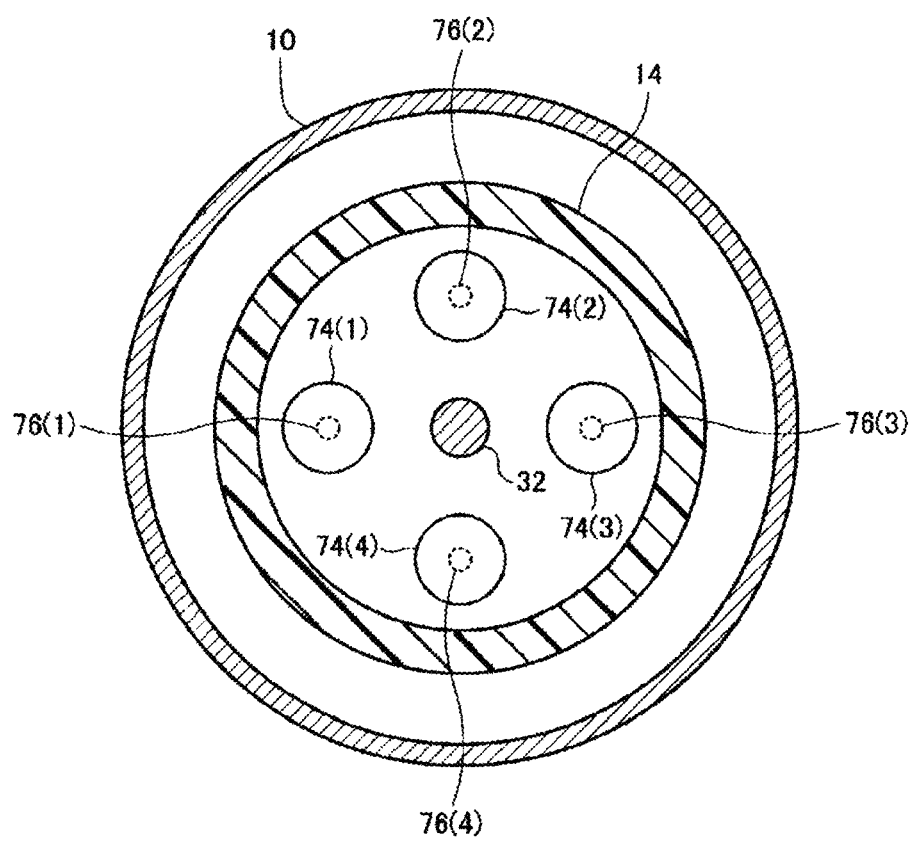
FIG. 28B is a transversal cross-sectional view of a two-dimensional layout of the main part of the embodiment (in FIG. 28A)

FIGS. 28A and 28B illustrate a configuration example showing that one or more inclined conductive plates 74(n) are spun by motors 124(n) via conductive rods 76(n). In the illustrated configuration example, each conductive plate 74(n), of which a top surface is inclined, is formed in a cylinder shape. Further, each conductive rod 76(n) is connected with a rotation axis of each motor 124(n) and electrically connected with the chamber's bottom wall 10b (conductive grounding member) via each rotation bearing 126(n).

However, in the plasma etching apparatus (FIG. 1) of the above embodiments, the connection point of the DC high-voltage line 44 to the electrostatic chuck 38 mounted on a main surface (or surface) of the susceptor 12 is a main cause of an asymmetric in the plasma density distribution on the susceptor 12 or the process characteristics on the semiconductor wafer W.

Actually, in the first experimental example, the connection point of the DC high-voltage line 44 is the same in the comparative example apparatus and the first embodiment apparatus, and in FIG. 3B, the connection point of the DC high-voltage line 44 is placed at a coordinate position in the X-Y plane (X=85 mm, Y=−85 mm) which is on the opposite side of the plasma density distribution controller 72 (particularly, the conductive rod 76).

In this case, in the plasma etching characteristics (comparative example apparatus) in FIG. 4, along the X-axis, the etching rates around the connection point (about 85 mm) of the DC high-voltage line 44 are decreased as if pulled downward, whereas the etching rates around its opposite position (point symmetry) (about −85 mm) are increased as if pulled upward. Meanwhile, along the Y-axis, the right and left (±) profiles are very similar to each other, but strictly, the etching rates around the connection point (about −85 mm) of the DC high-voltage line 44 are slightly decreased as if pulled downward, whereas the etching rates around its opposite position (point symmetry) (about 85 mm) are slightly increased as if pulled upward. To be noted is that a profile of the etching rates in the azimuthal direction can be modified by the connection point of the DC high-voltage line 44.

In short, it can be seen that, regarding the effect or influence of providing unbalance in the plasma density distribution on the susceptor 12 or the process characteristics on the semiconductor wafer W, the connection point of the DC high-voltage line 44 exhibits characteristics similar or equivalent to those of the conductive rod 76 of the plasma density distribution controller 72.

According to this knowledge or assumption, in order to suppress non-uniformity of plasma density distribution or an in-plane difference in process characteristics caused by a connection point of the DC high-voltage line 44, it is desirable to install the conductive rod 76 of the plasma density distribution controller 72 at the point symmetric position to the connection point of the DC high-voltage line 44.

Figure 29:
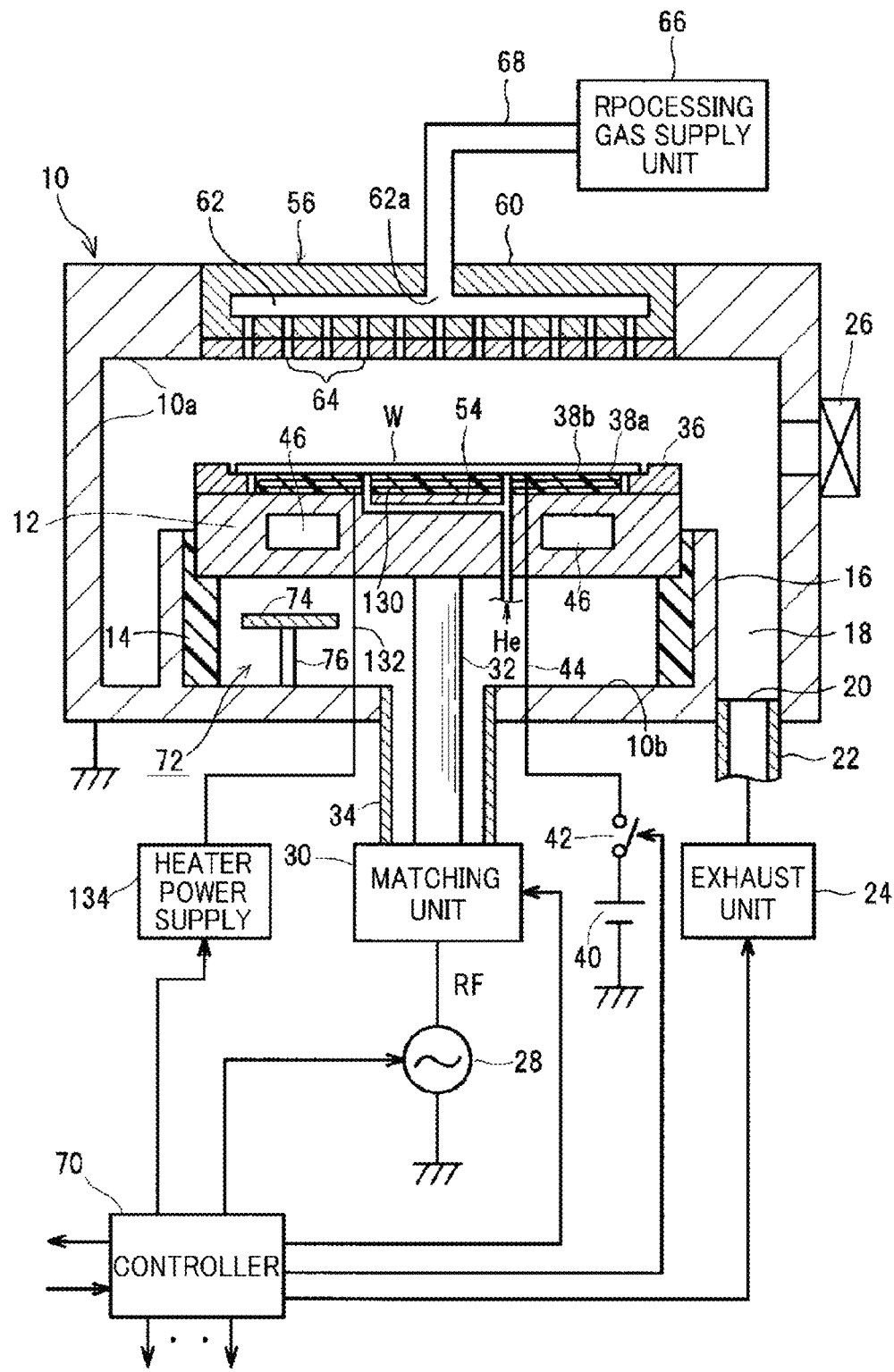
FIG. 29 is a longitudinal cross-sectional view of a configuration of a plasma processing apparatus in another embodiment.

FIG. 29 illustrates an embodiment of a plasma etching apparatus in which a resistance heating element that generates heat for a temperature control of a target object is installed in a susceptor 12. In the drawing, components having the same configuration or function as those in FIG. 1 are denoted by the same reference numbers.

In this embodiment, for example, a spiral-shaped resistance heating wire 130 is embedded in an insulating film 38a of an electrostatic chuck 38. A terminal of this resistance heating wire 130 is connected with an output terminal of a heater power supply 134 via a coated power feed line 132.

The heater power supply 134 is an AC output power supply for performing switching operation (on/off) of a commercial frequency by using, e.g., SSR.

In this plasma etching apparatus, a connection point of the coated power feed line 132 for the resistance heating wire 130 as well as the connection point of the DC high-voltage line 44 for the electrostatic chuck 38 cause an asymmetric configuration around the susceptor 12, and, thus, they may have an effect or influence of providing unbalance in plasma density distribution or process characteristics on a semiconductor wafer W. Since these causes of unbalance are combined, a configuration, a layout, or a function of each unit of the plasma density distribution controller 72 may be selected in order to cancel these causes.

Further, as described above, if each of the connection point of the DC high-voltage line 44 for the electrostatic chuck 38 and the connection point of the coated power feed line 132 for the resistance heating wire 130 is a cause to provide unbalance in plasma density distribution or process characteristics, it is possible to cancel an unbalance effect caused by each one by arranging the DC high-voltage line 44 and the coated power feed line 132 to be point-symmetric with respect to each other. In this case, the plasma density distribution controller 72 may be omitted.

Although illustration is omitted, as an arrangement example of the conductive plate 74 in the plasma density distribution controller 72, the conductive plate 74 may be attached to or embedded in a rear surface of the high-frequency electrode or facing electrode.

The above-described plasma etching apparatus is a capacitively coupled apparatus of a cathode-couple type, in which the upper electrode 56 is electrically grounded and a high frequency (RF) power is applied to the susceptor (lower electrode) 12. However, the present disclosure can be applied to a capacitively coupled plasma etching apparatus of anode-couple type, in which the susceptor (lower electrode) 12 is electrically grounded and a high frequency (RF) power is applied to the upper electrode 56, or a capacitively coupled plasma etching apparatus of a lower electrode RF dual-frequency application type, in which a first high frequency ($RF_1$) power for plasma generation and a second high frequency ($RF_2$) power for ion attraction control are simultaneously applied to the susceptor (lower electrode) 12.

Further, the present disclosure can be applied to a capacitively coupled etching apparatus of an upper-and-lower electrode RF dual-frequency application type, in which a first high frequency ($RF_1$) power for plasma generation is applied to the upper electrode 56 and a second high frequency ($RF_2$) power for ion attraction control is applied to the susceptor (lower electrode) 12, or a capacitively coupled plasma etching apparatus of a lower electrode RF triple-frequency application type, in which a first high frequency ($RF_1$) power for plasma generation, a second high frequency ($RF_2$) power for ion attraction control, and a third high frequency ($RF_3$) power are simultaneously applied to the susceptor (lower electrode) 12.

Furthermore, in accordance with the present disclosure, even if a high frequency power for ion attraction is applied to a susceptor for holding a target object in an inductively coupled plasma processing apparatus or a microwave plasma processing apparatus, the susceptor can serve as a high-frequency electrode. It can be applied to other plasma processing apparatuses performing plasma CVD, plasma oxidation, plasma nitridation, sputtering or the like. Moreover, the target substrate of the present disclosure is not limited to a semiconductor wafer and may be various substrates for flat panel display, a photomask, a CD substrate, a print substrate, and the like.

What is claimed is:

1. A plasma processing apparatus in which a high frequency electrode is provided in a processing chamber to mount a target object and, when a plasma process is performed on the target object in the processing chamber, a first high frequency power is applied to a rear surface of the high frequency electrode and a surface of the high frequency electrode is exposed to plasma of a processing gas, the apparatus comprising:

a plasma density distribution controller that is arranged to suppress a non-uniformity of plasma density around the high frequency electrode in an azimuthal direction; and a power feed rod connected with a central portion of the rear surface of the high frequency electrode and configured to supply the first high frequency power to the high frequency electrode, wherein the plasma density distribution controller comprises:

a first conductor which has first and second surfaces facing opposite directions to each other and is electrically connected with the rear surface of the high frequency electrode with respect to the first high frequency power, the first surface facing a portion of the rear surface of the high frequency electrode;

a second conductor which includes a first connecting portion electrically connected with a portion of the second surface of the first conductor and a second connecting portion electrically connected with a conductive grounding member electrically grounded with respect to the first high frequency power; and a rotation unit for rotating at least one of the first conductor and the second conductor around the power feed rod in an azimuthal direction of the high frequency electrode.

2. The plasma processing apparatus of claim 1, wherein the rotation unit rotationally moves the first conductor at a constant speed in the azimuthal direction of the high frequency electrode during a plasma process.

3. The plasma processing apparatus of claim 1, wherein the rotation unit rotationally moves the first conductor to a predetermined angular position.

4. The plasma processing apparatus of claim 1, wherein the second conductor is configured as an elevating mechanism.

5. The plasma processing apparatus of claim 1, wherein the first conductor and the second conductor are separated from each other, the first conductor is fixed to a predetermined height position, and the second surface of the first conductor is capacitively coupled and electrically connected with the first connecting portion of the second conductor.

6. The plasma processing apparatus of claim 5, wherein the rotation unit moves the second conductor to vary a position of the first connecting portion in an azimuthal direction of the high frequency electrode.

7. The plasma processing apparatus of claim 6, wherein the rotation unit rotationally moves the second conductor at a constant speed in the azimuthal direction of the high frequency electrode during a plasma process.

8. The plasma processing apparatus of claim 1, wherein the first conductor is capacitively coupled to the rear surface of the high frequency electrode.

9. The plasma processing apparatus of claim 1,
wherein the first and second conductors are distanced away from the power feed rod in a radial direction.

10. The plasma processing apparatus of claim 1, wherein the first conductor is a conductive plate having the first and second surfaces substantially parallel to each other.

11. The plasma processing apparatus of claim 1,
wherein electric field intensity on the first surface of the first conductor is not uniform and becomes maximum at a position corresponding to the first connecting portion.

12. The plasma processing apparatus of claim 1, wherein a facing electrode is provided to face the high frequency electrode parallel to each other at a predetermined distance therebetween within the processing chamber and is electrically grounded, and the target object is mounted on the high frequency electrode.

13. The plasma processing apparatus of claim 1, wherein a second high frequency power having a frequency different from that of the first high frequency power is applied to the high frequency electrode from its rear surface during the plasma process, and the first conductor is electrically connected with the rear surface of the high frequency electrode and is electrically grounded via the second conductor with respect to the second high frequency power.

14. The plasma processing apparatus of claim 1, wherein the rear surface of the high frequency electrode, the first conductor and the second conductor are placed in an atmosphere region isolated from a depressurized space of the processing chamber.

15. The plasma processing apparatus of claim 14, wherein the first and second conductors are installed within a cylindrical insulating member extending from a bottom wall of the processing chamber to an outer peripheral portion of the high frequency electrode.

* * * * *